United States Patent [19]

Igarashi et al.

[11] Patent Number: 5,115,317
[45] Date of Patent: May 19, 1992

[54] TUNING APPARATUS FOR A TELEVISION RECEIVER INCLUDING SELECTIVELY ACTIVATED AMPLIFIER AND LOCAL OSCILLATOR CIRCUITS

[75] Inventors: Sadao Igarashi; Susumu Ushida, both of Soma, Japan

[73] Assignee: Alps Electric Co., Ltd., Tokyo, Japan

[21] Appl. No.: 628,741

[22] Filed: Dec. 17, 1990

[30] Foreign Application Priority Data

Dec. 22, 1989 [JP] Japan .................................. 1-334226
Jan. 22, 1990 [JP] Japan .................................. 2-12022

[51] Int. Cl.$^5$ ............................................. H04N 5/50
[52] U.S. Cl. ................................. 358/191.1; 358/184; 455/190.1; 455/180.2
[58] Field of Search .................... 358/188, 191.1, 189, 358/193.1, 194.1, 184; 455/190, 188, 196, 180; 330/126; 331/111

[56] References Cited

U.S. PATENT DOCUMENTS

| | | | |
|---|---|---|---|
| 3,579,251 | 5/1971 | Lovelace | 358/184 |
| 4,209,805 | 6/1980 | Ikeda | 358/184 |
| 4,258,329 | 3/1981 | Tokumo | 330/126 |
| 4,322,856 | 3/1982 | Ohta | 455/190 |
| 4,476,583 | 10/1984 | Muterspaugh | 455/180 |
| 4,481,673 | 11/1984 | Muterspaugh | 455/180 |
| 4,499,602 | 2/1985 | Hermeling | 455/190 |
| 4,598,259 | 7/1986 | Gontowski | 331/111 |
| 4,691,378 | 9/1987 | Kunamoto et al. | 455/301 |
| 4,982,444 | 1/1991 | Matsuura | 358/191.1 |

FOREIGN PATENT DOCUMENTS 1284007 9/1970 Japan .
2205013A 3/1988 United Kingdom .

Primary Examiner—James J. Groody
Assistant Examiner—Sherrie Hsia
Attorney, Agent, or Firm—Guy W. Shoup; B. Noel Kivlin

[57] ABSTRACT

A tuning apparatus is disclosed in which a television signal of either the UHF band or the VHF band is subjected to frequency conversion to obtain an intermediate frequency and, thereby, the television signal for a desired channel is selected. The tuning apparatus allows either the television signal of the UHF band or the television signal of the VHF band to be converted to an intermediate frequency by means of a common mixer. The mixer is constituted of a balanced mixer of a two-pair differential type. The tuning apparatus includes a local oscillator for reception of the UHF band and a local oscillator for reception of the VHF band. The intermediate frequency stage as the output of the mixer is provided with an attenuator of which the degree of attenuation when the UHF band is received and that when the VHF band is received are different and, thereby, the gains of the apparatus as a whole are equal when receiving the UHF band and when receiving the VHF band. Deterioration in the noise factor is thereby lessened. The RF amplifiers and local oscillators are each provided with a constant current circuit on the emitter side of the amplifying transistor circuit or the oscillator transistor circuit, and the UHF receivable state or the VHF receivable state is brought about by activating or deactivating the constant current circuit. The local oscillation signal is adapted to be supplied to the mixer through amplifiers in two stages and the local oscillation signal for PLL controlling is taken out from the output of the amplifier in the first stage.

8 Claims, 23 Drawing Sheets

TUNING APPARATUS FOR A TELEVISION RECEIVER INCLUDING SELECTIVELY ACTIVATED AMPLIFIER AND LOCAL OSCILLATOR CIRCUITS

BACKGROUND OF THE INVENTION

1. Field of the Invention

The present invention relates to a tuning apparatus for use in a television receiver, video tape recorder, and the like.

2. Description of the Prior Art

FIG. 25 is a block diagram showing an example of the structure of a prior art electronic tuning apparatus (synthesizer tuner). The operation of this apparatus will be described below.

To the antenna input terminal 1 are input television signals of the VHF band and UHF band (television broadcast signal or reproduced radio-frequency (RF) signal from a video tape recorder). The television signal of the VHF band is input to a bandpass filter 2 of a VHF circuit VC and, when it is set so that a television signal of the VHF band is received, the television signal of the desired reception channel is selected in a tuning circuit 3. The thus selected desired television signal is amplified in an RF amplifier 4, enhanced for selectivity in a tuning circuit 5, and input to a VHF mixer 6. This received signal is mixed with an oscillation signal from a VHF local oscillator 7 in the VHF mixer 6 to be converted into an intermediate frequency (IF) signal. The IF signal is amplifier in an IF amplifier 8, passed through an IF filter 9, and output from an IF output terminal 10. In like manner, when it is set so that a television signal of the UHF band is received, the desired reception television signal is selected from the television signals of the UHF band in a tuning circuit 12 of a UHF circuit UC. The thus selected desired television signal is amplified in an RF amplifier 13, enhanced for selectivity in a tuning circuit 14, and input to a UHF mixer 15. This received signal is mixed with an oscillation signal from a UHF local oscillator 16 in a UHF mixer 15 to be converted into an IF signal. This IF signal is input to the IF amplifier 8 through a bandpass filter 17, amplified in the IF amplifier 8, and passed through the IF filter 9 to be output from the output terminal 10. Each of the outputs of the VHF local oscillator 7 and UHF local oscillator 16 is input to a PLL circuit Pl constituted of a prescaler 18, programmable divider 19, and phase comparator 20. Reference numeral 21 denotes a channel selector for selecting a desired channel.

FIG. 26 is a diagram showing a structure of a portion of a prior art tuning apparatus of the described type. Referring to the diagram, reference numeral 101 denotes a transistor for amplifying a signal of the VHF band, 102 denotes a transistor for amplifying a signal of the UHF band, 103 denotes a transistor which is turned on when the VHF band is selected, 104 denotes a transistor which is turned on when the UHF band is selected, 105 and 106 denote resistors, and 107 denotes a terminal to which a D.C. power is supplied.

As described above, prior art tuning apparatuses were provided with two mixers, i.e., one mixer 6 for the VHF band and the other mixer 15 for the UHF band. However, the provision of two mixers not only made the circuit configuration complex but also produced many wire crossovers when the apparatus was arranged in an integrated circuit (IC) array, whereby stray capacitance was introduced into the circuit and the impedance matching was made difficult, and in consequence, obtaining good performances from the apparatus was rather difficult.

Further, since the VHF local oscillator 7 and the UHF local oscillator 16 were directly connected to the prescaler 18 to supply the same with the local-oscillator signal, closed loops were formed by the prescaler 18, two local oscillator 7, 16, and two mixer 6, 15. Hence, there was a problem of higher harmonics from the prescaler 18 penetrating into the local oscillators and mixers thereby causing unstable operation and beat interference, and the configuration was particularly unsuitable when it is realized on an IC.

Furthermore, the total gain of the tuning apparatus when it receives the VHF band is greater than that when it receives the UHF band. Thus, when attempting to compensate for the difference in the gains wholly by an automatic gain control (AGC) operation in the RF amplifier 4 of the VHF circuit VC, a problem of deterioration in the noise factor (NF) occurred.

In addition, the band switching method for switching between the UHF and VHF bands in the prior art tuning apparatus by tuning on/off switching transistors 103, 104 between the amplifying transistors 101, 102 and the power supply terminal 107 such a band switching method had the following problems:

① When the transistor 103 is turned on, the transistor 103 and resistor 105 are connected in parallel with the load of the transistor 101. The impedance of the transistor 103 varies as the collector current of the transistor 101 is changed. Consequently, in this circuit, the load impedance of the transistor 101 changes depending on the collector current.

② The transistor 104 is turned off when the transistor 103 is turned on, but since the transistor 104 has stray capacitance in this case, the circuit including the transistor 102 is not completely isolated from the circuit on the VHF side in terms of radio frequency, and thereby, a bad effect is produced on the received signal of the VHF band.

The same is also true when the transistor 103 is turned off and the transistor 104 is turned on.

③ While NPN type transistors having good RF characteristics are used for amplifying transistors 101, 102, it is necessary to use PNP type transistors for the switching transistors 103, 104 on account of the polarity of the power supply thereto. When such circuits including two kinds of transistors are arranged in an IC array, the fabrication process becomes complex.

OBJECTS AND SUMMARY OF THE INVENTION

Accordingly, in view of the foregoing, it is an object of the present invention to provide a tuning apparatus of a simple circuit configuration.

It is another object of the present invention to provide a tuning apparatus in which the problems resulting from the switching between the UHF band and the VHF band are solved.

It is a further object of the present invention to provide a tuning apparatus in which oscillators and mixers are not adversely affected by higher harmonics produced by the prescaler.

It is a still further object of the present invention to provide a tuning apparatus which does not suffer from deterioration in NF when receiving a signal of the VHF band.

It is a further object of importance of the present invention to provide a tuning apparatus that can be easily arranged in an IC array.

In order to solve the above enumerated problems, the tuning apparatus of the present invention comprises a first amplifier for amplifying a signal of a first, UHF, band, a second amplifier for amplifying a signal of a second, VHF, band, a common mixer for converting an output signal from either of the first and second amplifiers to an IF signal, and a first and a second local oscillator for supplying the mixer with a local-oscillator signal corresponding to signal reception of the first or second band.

In addition, the tuning apparatus is arranged such that amplifying transistors and oscillating transistors are on/off switched by their respective constant-current circuits in response to signal reception of the UHF band or the VHF B. Each of the first and second local oscillation signals is input to a PLL control circuit after being amplified. Further, in order to diminish the difference in the gains between the UHF band and the VHF band, an attenuator is provided at the output of the mixer.

According to the present invention, received signals of the UHF band and the VHF band are input to a single mixer and converted to an IF signal. While the IF signal converted from the UHF band is input directly to the succeeding stage, the IF signal converted from the VHF band is attenuated by the attenuator before being input to the succeeding stage.

Since a larger degree of attenuation is provided by the attenuator at the time of VHF signal reception, the difference in the gains between the UHF and VHF bands can be minimized.

The UHF and VHF reception bands can be switched by turning on/off the constant-current circuits for the RF amplifiers and local oscillators for the UHF and VHF bands such that these amplifiers and local oscillators are brought into an activated or inactivated state.

Further, since the local oscillation signals for the UHF and VHF bands are separately amplified before being input to the mixer and these signals are both amplified before being supplied to the PLL circuit, the higher harmonics generated from the prescaler never penetrate into the mixer and local oscillators.

DESCRIPTION OF THE PREFERRED EMBODIMENT

Figure 1:
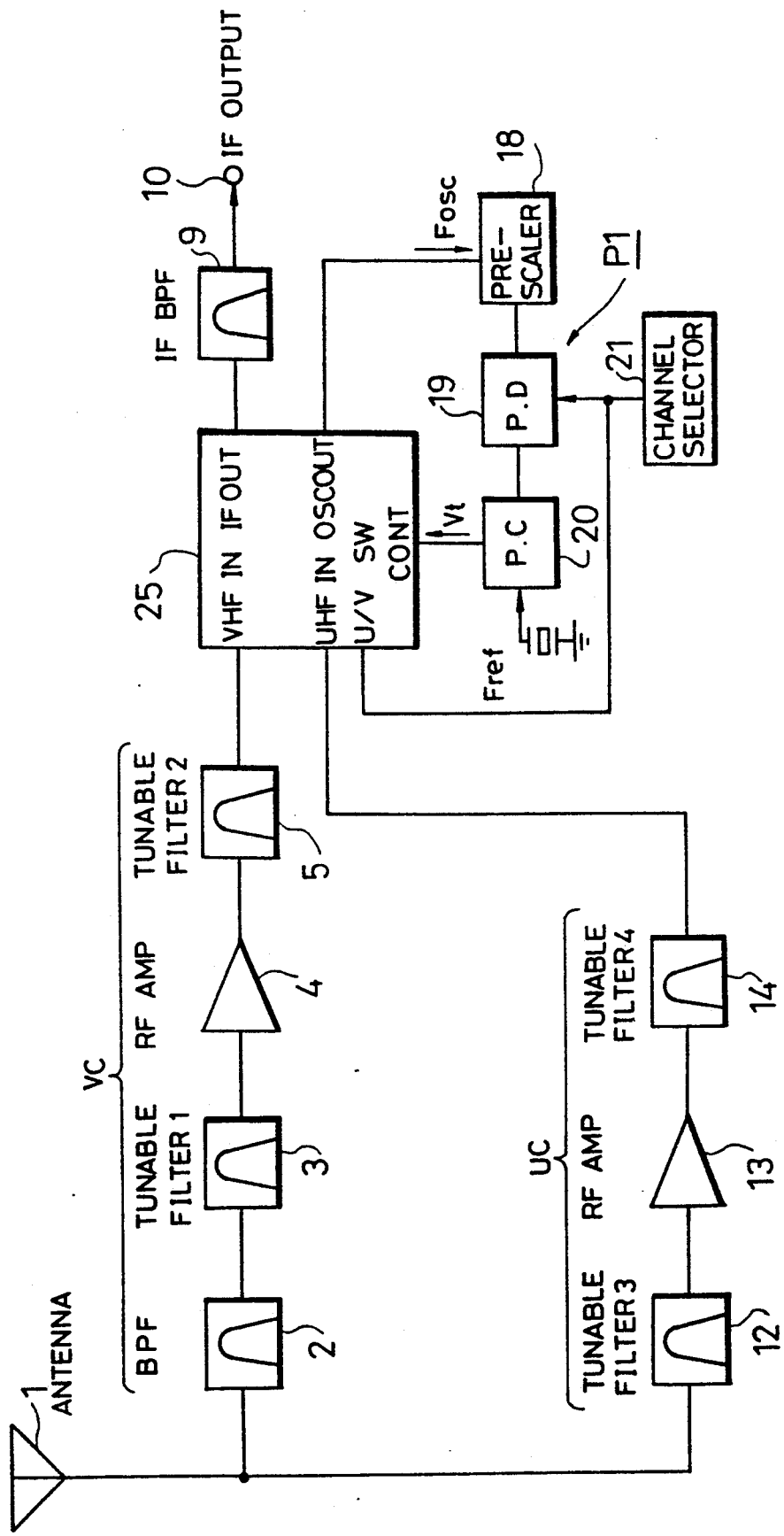
FIG. 1 is a block diagram showing a structure of a tuning apparatus according to the present invention.
Figure 25:
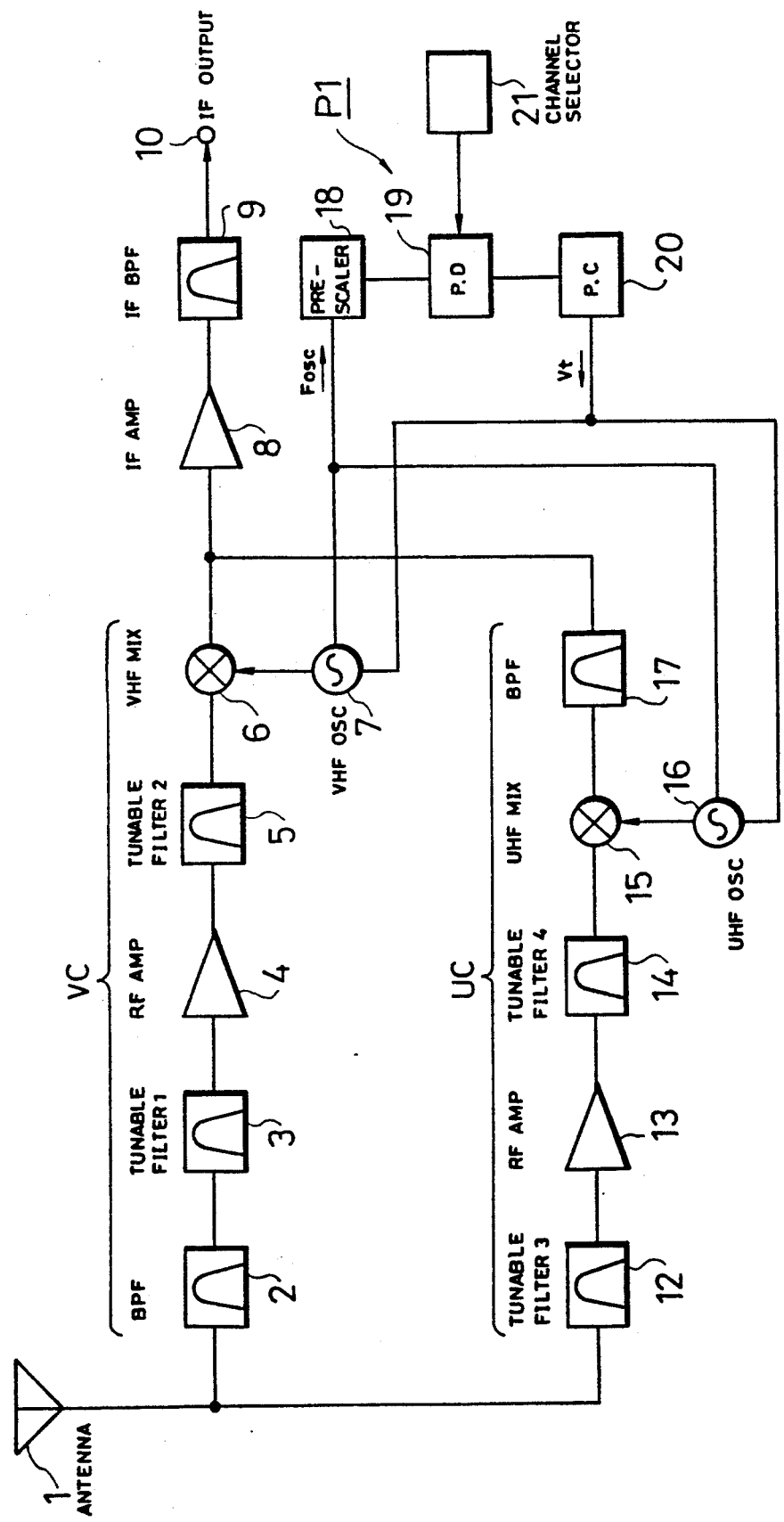
FIG. 25 is block diagram showing an example of a structure of a prior art tuning apparatus.
Figure 26:
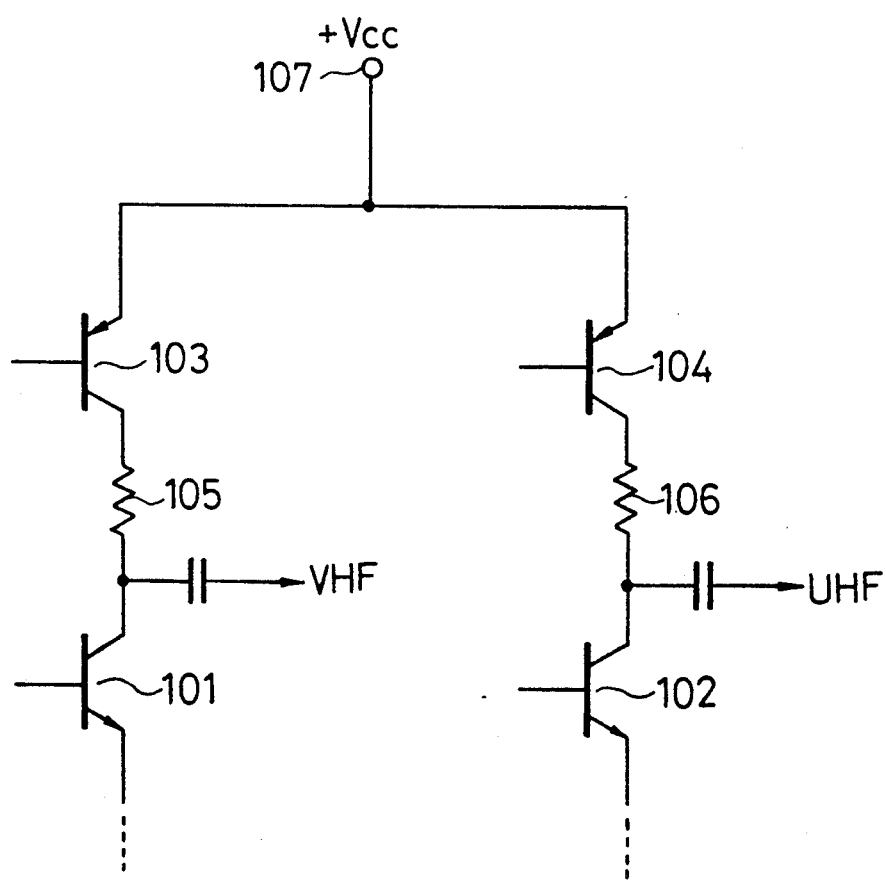
FIG. 26 is a diagram showing an example of a structure of a prior art reception band switching circuit.

An embodiment of the present invention will be described below with reference to the accompanying drawings. FIG. 1 is a block diagram showing a structure of a tuning apparatus for a television receiver according to an embodiment of the present invention. Referring to the diagram, the parts corresponding to those in FIG. 25 are denoted by corresponding reference numerals and description thereof will be omitted. The point in which the circuit in this diagram differs from the circuit in FIG. 25 is that a mixing unit 25 is provided in place of the mixers 6, 15, local oscillators 7, 16, and the bandpass filter 17 in FIG. 25.

Figure 2:
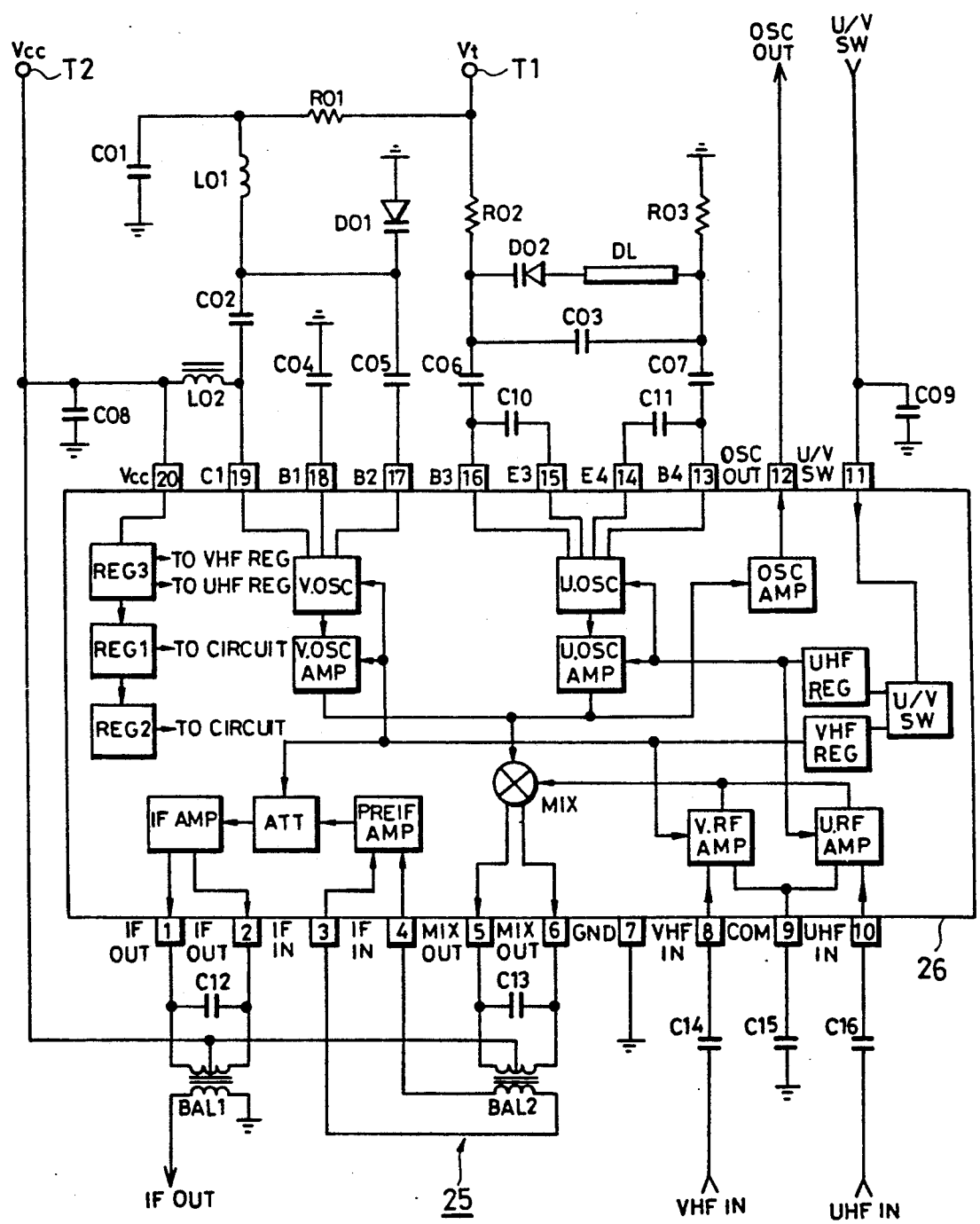
FIG. 2 is a circuit diagram showing a structure of a mixing unit 25 in the tuning apparatus.

FIG. 2 is a diagram showing a structure of the mixing unit 25. As shown in this diagram, the mixing unit 25 is constructed of an array of integrated circuits 26 and the peripheral circuits thereof.

Figure 3:
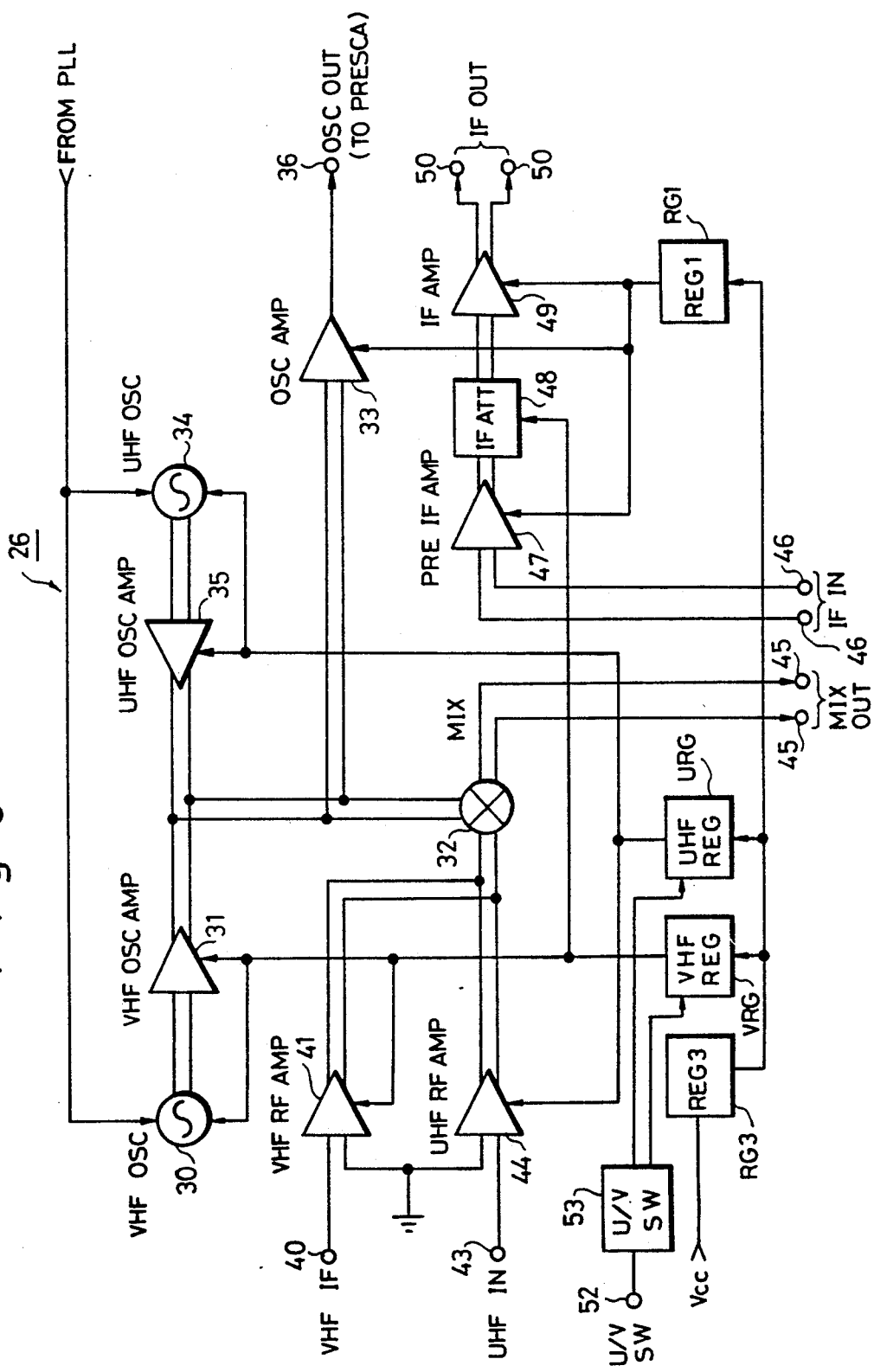
FIG. 3 is a block diagram showing a structure of integrated circuits 26 constituting the mixing unit 25.

FIG. 3 is a block diagram showing a circuit configuration of the integrated circuit 26. This circuit has its signal system arranged in a balanced type configuration. The structure of the integrated circuits 26 will be described below in detail. The output terminal of a VHF local oscillation circuit 30 is connected with a mixer 32 and an amplifier 33 through a VHF local oscillation amplifier 31. Similarly, the output terminal of a UHF local oscillation circuit 34 is connected with the mixer 32 and the amplifier 33 through a UHF local oscillation amplifier 35. The output terminal of the amplifier 33 is connected to a local oscillation output terminal 36. This output terminal 36 is connected to the prescaler 18 of FIG. 1.

A VHF input terminal 40, to which the VHF television signal output from the tuning circuit 5 of FIG. 1 is input, is connected to the input terminal of a VHF RF amplifier 41. The output terminal of the VHF RF amplifier 41 is connected to the mixer 32. Similarly, a UHF input terminal 43, to which UHF television signal output from the tuning circuit 14 of FIG. 1 is input, is connected to the input terminal of a UHF RF amplifier 44. The output terminal of the UHF RF amplifier 44 is connected to the mixer 32. The input terminals of the VHF RF amplifier 41 and the UHF RF amplifier 44 are each arranged in a balanced input type configuration and one of the input terminals of the VHF RF amplifier 41 and one of the input terminals of the UHF RF amplifier 44 are connected in common and grounded for radio frequency. The output of the mixer 32 is connected to a mixed output terminal 45.

An IF input terminal 46 is input to an IF amplifier 49 through a pre-IF amplifier 47 and attenuator 48 and the output terminal of the IF amplifier 49 is connected to an IF output terminal 50. A U/V switching terminal 52 is connected to a U/V switching circuit 53, and a first output terminal of the U/V switching circuit 53 is connected to a UHF power regulating circuit URG and a second output terminal thereof is connected to a VHF power regulating circuit VRG. The output terminal of the UHF power regulating circuit URG is connected to each of the UHF local oscillation circuit 34, UHF local oscillation amplifier 35, and the UHF RF amplifier 44 for regulating the constant-current circuit provided for each thereof. Similarly, the output terminal of the VHF power regulating circuit VRG is connected to each of the VHF local oscillation circuit 30, VHF local oscillation amplifier 31, VHF RF amplifier 41, and the attenuator 48 for regulating the constant-current circuit provided for each thereof. The output of a power regulating circuit RG1 is connected with the amplifier 33, pre-IF amplifier 47, and the IF amplifier 49 for controlling the constant-current circuit within each thereof.

A constant voltage generating circuit RG2 (not shown) supplies the bias voltage for each of the VHF local oscillation circuit 30, UHF local oscillation circuit 34, VHF local oscillation amplifier 31, UHF local oscillation amplifier 35, and the pre-IF amplifier 47. A voltage output circuit RG3 supplies a D.C. voltage to the UHF power regulating circuit URG, VHF power regulating circuit VRG, power regulating circuit RG1, and the above described constant-voltage generating circuit RG2.

Operations of the above mentioned circuits will be described below.

If a switching signal for selecting the UHF band is input through the U/V switching terminal 52, the output of the UHF power regulating circuit URG is brought into an enabled state and the output of the VHF power regulator VRG is brought into an disabled state. Thereby, the constant-current circuits within the UHF local oscillation circuit 34, UHF local oscillation amplifier 35, and the UHF RF amplifier 44 are operated and are activated. On the other hand, since, at this time, the output of the VHF power regulating circuit VRG is disabled, the VHF local oscillation circuit 30, VHF RF amplifier 41, and the attenuator 48 are inactivated.

A television signal of the UHF band input to the UHF input terminal 43 is amplified by the UHF RF amplifier 44 and is converted to a balanced output to be input to the mixer 32. Meanwhile, a balanced oscillation signal from the UHF local oscillation circuit 34 is amplified by the UHF local oscillation amplifier 35 in the succeeding stage and input to the mixer 32 as a local oscillation signal. Accordingly, at the time of reception of the television signal of the UHF band, the balanced television signal of the UHF band and the balanced oscillation signal from the UHF local oscillation circuit 34 are input to the mixer 32, and these signals are converted to a balanced IF signal to be output from the mixer 32 and input to the mixed output terminal 45.

The balanced IF signal output from the mixed output terminal 45 is next input an IF input terminal 46 through a capacitor C13 and a balanced transformer BAL2 as shown in FIG. 2. The balanced IF signal input to the IF input terminal 46 is amplified by the pre-IF amplifier 47 and input to the IF amplifier 49 through the attenuator 48. At this time, the attenuator 48 is in an inactivated state and, hence, the output of the pre-IF amplifier 47 is not attenuated before being supplied to the IF amplifier 49. The IF amplifier 49 amplifies the input IF signal and provides an output signal to the IF output terminal 50.

In the case of reception of a television signal of the VHF band, a television signal of the VHF band input to the VHF input terminal 40 is amplified by the VHF RF amplifier 41 and is converted into a balanced output to be input to the mixer 32. A balanced oscillation signal from the VHF local oscillation circuit 30 is amplified by the VHF local oscillation amplifier 31 in the succeeding stage and is input to the mixer 32. Thereby, an IF signal is output from the mixer 32 and is input to the pre-IF amplifier 47 through the mixed output terminal 45, capacitor C13 and balanced transformer BAL2 (FIG. 2), and the IF input terminal 46. The signal input to the pre-IF amplifier 47 is amplified by amplifier 47 and input to the attenuator 48. At this time, the attenuator 48 is in an activated state and, hence, the output of the pre-IF amplifier 47 is attenuated a predetermined quantity by the attenuator 48 and accordingly is input to the IF amplifier 49. The IF amplifier 49 amplifies the input IF signal and provides the amplified signal to the IF output terminal 50.

Since the frequency of the television signal of the VHF band is lower than that of the television signal of the UHF band, the amplification factor of the VHF RF amplifier 41 and the conversion efficiency of the mixer 32 for the VHF band are higher than those for the UHF band. The attenuator is thus provided for attenuating the increased gain of the VHF band due to these factors such that the output level for the VHF band is made equal to that of the UHF band.

The local oscillation signal amplified by the amplifier 33 and output from the local oscillation output terminal 36 is input to the prescaler 18 shown in FIG. 1.

Consider next a detailed description of each of the circuit blocks of FIG. 3 as described below.

[1] VHF local oscillation circuit 30

Figure 4:
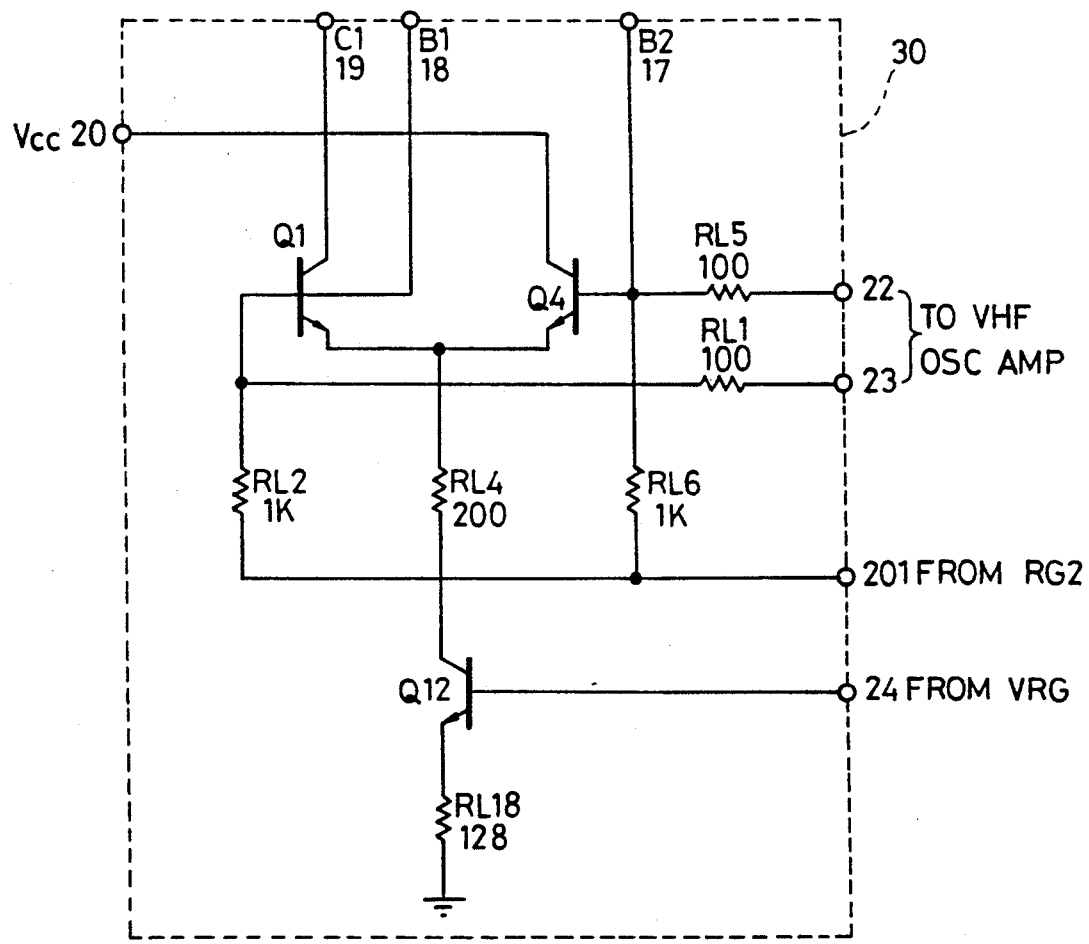
FIG. 4 to FIG. 24 are circuit diagrams showing a particular structure of each of the blocks within the integrated circuits 26.

FIG. 4 shows a structure of the VHF local oscillation circuit 30. In this circuit, Q1 and Q4 denote transistors constituting a balanced oscillator and Q12 denotes a transistor constituting a constant-current circuit. The collector and base of the transistor Q1 and the collector and base of the transistor Q4 are connected with a variable reactance circuit for determining the oscillation frequency, which is provided outside the integrated circuits 26 and constituted of capacitors C01, C02, C04, C05, and C08 (refer to FIG. 2), a variable capacitance diode D01, a resonance coil L01, a choke coil L02, and a resistor R01. The terminal T1 in FIG. 2 is supplied with an oscillation frequency control voltage Vt. The terminal 20 in FIG. 4 is supplied with the power voltage Vcc and the terminal 201 is supplied with a D.C. voltage from the above described constant-voltage generating circuit RG2 (not shown), wherefrom base bias voltages are supplied to the transistors Q1 and Q4 through resistors RL2 and RL6. The terminal 24 is supplied with a constant-current regulating voltage from the VHF power regulating circuit VRG (refer to FIG. 3). The bases of the transistors Q1 and Q4 output an oscillation signal to the terminals 22 and 23 through resistors RL5 and RL1. The terminals 22 and 23 are connected with the input terminal of the VHF local oscillation amplifier 31 (FIG. 3).

In the connected state as described above, the constant-current circuit formed of the transistor Q12 and resistors RL4 and RL18 allows a predetermined constant current as the sum total of the emitter currents of the transistors Q1 and Q4 to flow therethrough. Meanwhile, the reactance value of the above described variable reactance circuit is determined by the oscillation frequency control voltage from the terminal T1 (FIG. 2), whereby the oscillation signal from the balanced oscillation circuit formed of the transistors Q1 and Q4 is allowed to oscillate at a predetermined oscillation frequency.

If the constant-current regulating voltage to the terminal 24 is sufficiently larger than the Vbe (base-emitter voltage) of the transistor Q12, the constant-current circuit is brought into an on state and the oscillation circuit is activated, but if it is sufficiently smaller than the Vbe of the transistor Q12, the constant-current circuit is brought into an off state and the oscillation circuit is inactivated. Thus the VHF local oscillation circuit 30 is on/off controlled by the constant-current regulating voltage.

Figure 6:
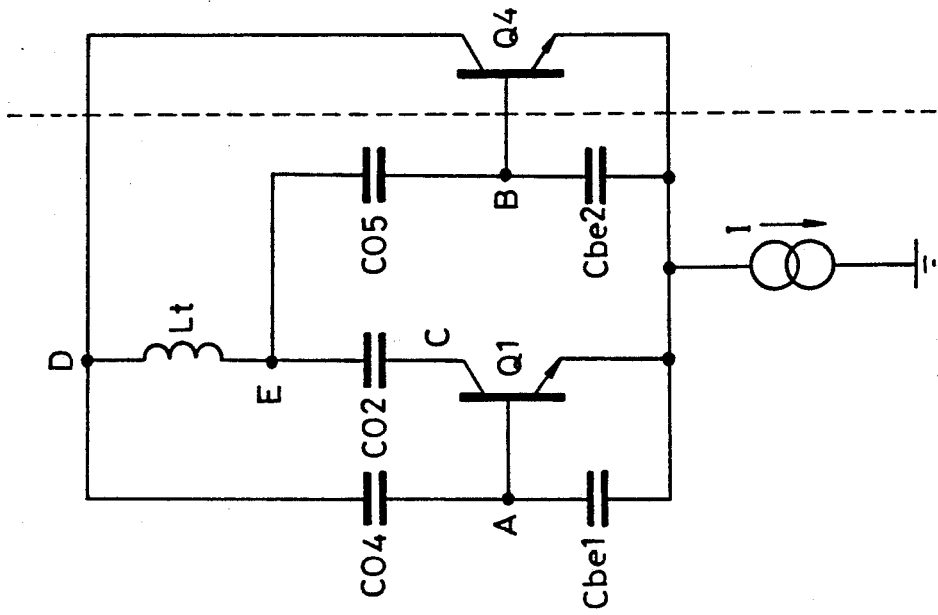
Figure 5:
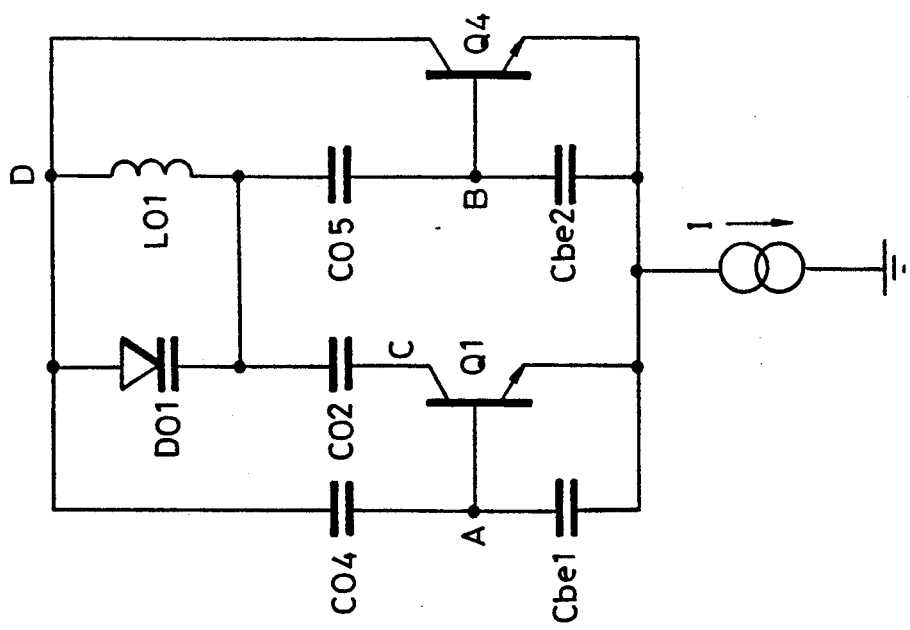

The operation of the VHF local oscillation circuit 30 will be described below in detail with reference to equivalent circuits (FIG. 5 and FIG. 6). Between the base and emitter of the transistors Q1 and Q4, there exist diffusion capacitance, stray capacitance, etc. of the transistors Q1 and Q4, which are represented by Cbe1 and Cbe2. Since the capacitors C01 and C08 are grounding capacitance for radio frequency and have a very low impedance to radio frequency, while the choke coil L02 has a very high impedance to radio frequency, the circuit shown in a portion of FIG. 2 and in FIG. 4, when attention is paid to its behavior with respect to radio frequency, can be represented as a radio-frequency equivalent circuit as shown in FIG. 5, omitting the D.C. biases, power supply Vcc, and the like (but not omitting the constant-current circuit). Further, representing the parallel connection of the variable-capacitance diode D01 and the coil L01 in FIG. 5, which is inductive at the oscillation frequency, by an inductance Lt, the circuit of FIG. 5 can be represented by the circuit of FIG. 6. Thus, the VHF local oscillation circuit 30 shown in FIG. 4 can be represented by the radio-frequency equivalent circuit as shown in FIG. 6. The values of the capacitors C04, C02 and inductance Lt of FIG. 6 are selected such that, at the oscillation frequency, the circuit between points A, D, and C becomes inductive and the circuit between points C and D also becomes inductive, and thus the portion on the left-hand side of the broken line of the equivalent circuit constitutes a Colpitts oscillation circuit.

In this circuit, the moment the collector current of Q1 increases, the collector voltage of Q1 decreases and, because this collector voltage is impressed on the base of the transistor Q4 through the capacitors C02 and C05, the transistor Q4 has its base voltage lowered and collector current decreased, and thus, the transistors Q1 and Q4 operate 180° out of phase. Further, since the constant-current circuit is connected to the emitters of the transistors Q1 and Q4, the out-of-phase operation is promoted. Therefore, the VHF local oscillation circuit shown in FIG. 4 operates as a balanced oscillation circuit and a balanced oscillation signal is obtained from the bases of the transistors Q1 and Q4 (points A and B).

[2] VHF local oscillation amplifier 31

Figure 7:
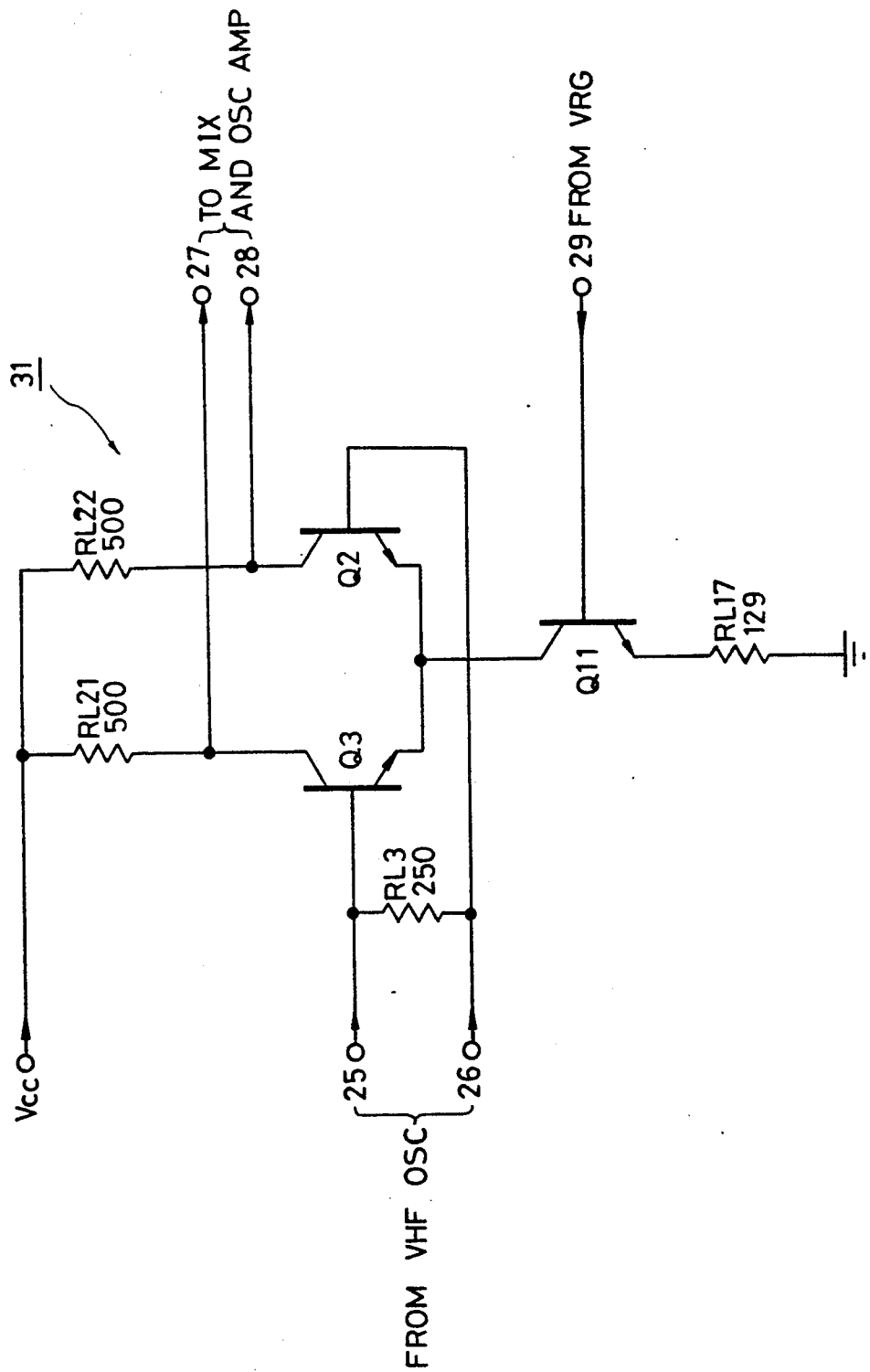

FIG. 7 shows a structure of the VHF local oscillation amplifier 31. In this circuit, Q2 and Q3 denote transistors constituting a differential amplifier and Q11 denotes a transistor constituting a constant-current circuit. The terminal 29 is supplied with a constant-current regulating voltage from the VHF power regulating circuit VRG. Hence, the transistor Q11 becomes a constant-current circuit passing, through its collector, a constant current, the value of which is determined by the resistor RL17 and the constant-current regulating voltage. A balanced VHF oscillation signal input from the VHF local oscillation circuit 30 through the terminals 25 and 26 is amplified by the transistors Q2 and Q3 and output from the terminals 27 and 28.

A resistor RL3 is inserted to suitably attenuate the oscillation signal output from the VHF local oscillation circuit 30 (i.e., to make the output voltage approximately equal to that of the UHF local oscillation circuit 34).

[3] UHF local oscillation circuit 34

Figure 8:
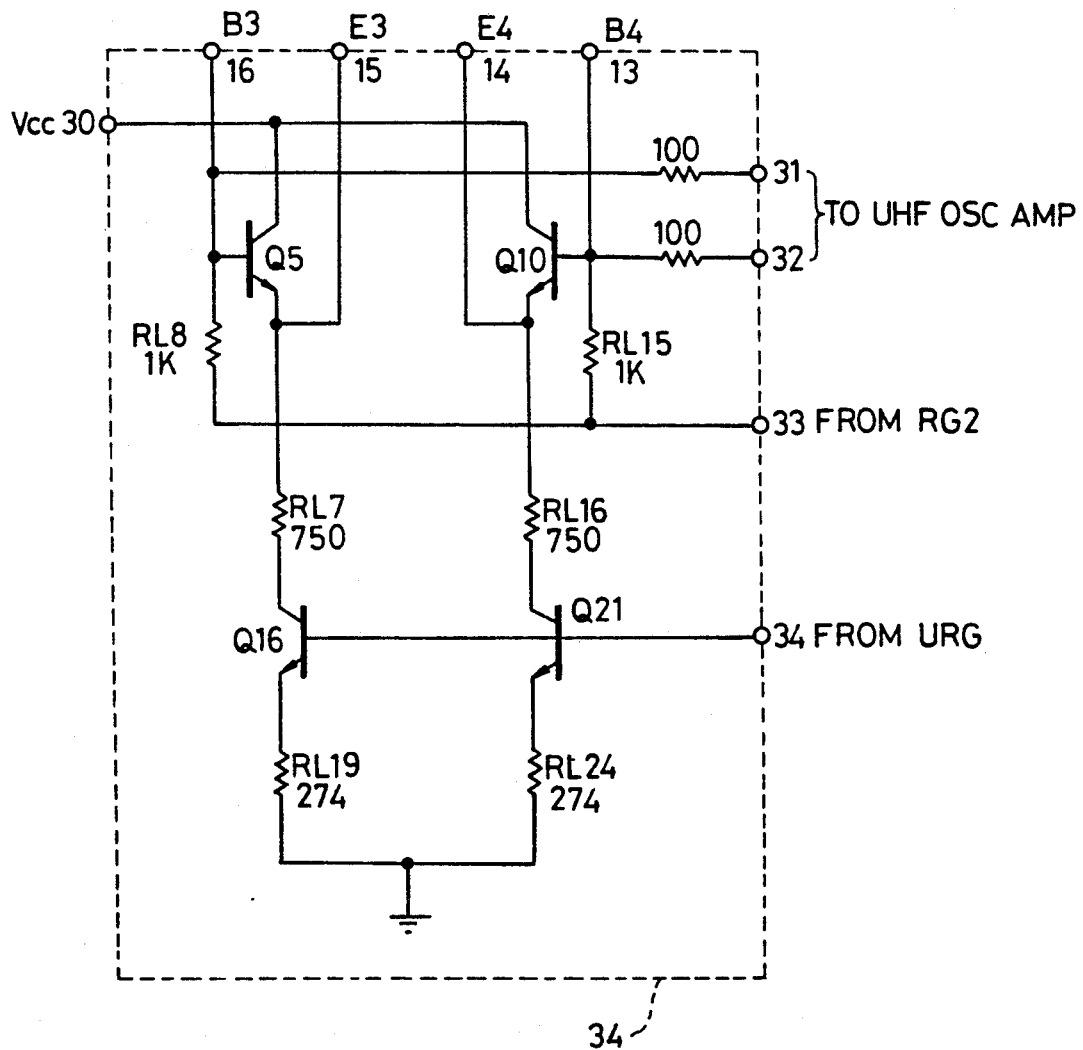

FIG. 8 shows a structure of the UHF local oscillation circuit 34. In this diagram, transistors Q5 and Q10 constitute a balanced oscillator and transistors Q16 and Q21 constitute constant-current circuits. The bases and emitters of the transistors Q5 and Q10 are connected with a variable-reactance circuit for determining the oscillation frequency, which is provided outside the integrated circuits 26 (refer to FIG. 2) and constituted of capacitors C10, C11, C06, C07, and C03, a variable-capacitance diode D02, a distributed parameter line DL, and resistors R02 and R03. To the terminal T1 in FIG. 2 is applied the oscillation signal control voltage.

The terminal 30 in FIG. 8 is supplied with the power voltage Vcc. The terminal 33 is applied with a D.C. voltage from the constant-voltage generating circuit RG2 and supplies the base bias voltage to the transistors Q5 and Q10. The terminal 34 is supplied with the constant-current regulating voltage from the UHF power regulating circuit URG and accordingly supplies the voltage to the bases of the transistors Q16 and Q21. From the bases of the transistors Q5 and Q10, an oscillation signal is output to the terminals 31 and 32 through the resistors RL9 and RL14, respectively. The terminals 31 and 32 are connected with the input of the UHF local oscillation amplifier 35.

In the connected state as described above, formed of the transistor Q16 and resistors RL7 and RL19 and formed of the transistor Q21 and resistors RL16 and RL24 allows a predetermined constant current to flow through each emitter of the transistors Q5 and Q10. Meanwhile, the reactance value of the above described variable reactance circuit is determined according to the oscillation signal control voltage from the terminal T1 (FIG. 2), whereby the balanced oscillator formed of the transistors Q5 and Q10 is allowed to oscillate at a predetermined frequency.

When the constant-current regulating voltage supplied to the terminal 34 is sufficiently larger than the Vbe (base-emitter voltage) of the transistors Q16 and Q21, the constant-current circuits are turned on and the oscillating circuit is activated, whereas if the same is sufficiently smaller than the Vbe of the transistors Q16 and Q21, the constant-current circuits are turned off and the oscillation circuit is not activated.

The operation of the above mentioned UHF local oscillation circuit 34 will be described below in detail with reference to equivalent circuits (FIG. 9 to FIG. 12).

The series circuit of the variable-capacitance diode D02 and distributed parameter line DL in FIG. 2, when the oscillation frequency control voltage is applied to the terminal T1, is considered to be equivalent to a distributed parameter line Lt approximately half the wavelength (a little shorter than a half of the wavelength, to be exact). Further, since there exists output capacitance, stray capacitance, and the like associated with the transistors Q5 and Q10 between the collector and emitter of the transistors Q5 and Q10 in FIG. 8, such capacitances are respectively represented by Cce1 and Cce2. By omitting the constant-current circuits, D.C. bias circuit, and the like in FIG. 8 and paying attention to the operation with respect to radio frequency, the circuit in FIG. 8 becomes equivalent to the circuit shown in FIG. 9. Character V in FIG. 9 indicates a standing-wave voltage distributed along the distributed parameter line Lt while the oscillation is being generated.

Figure 10:
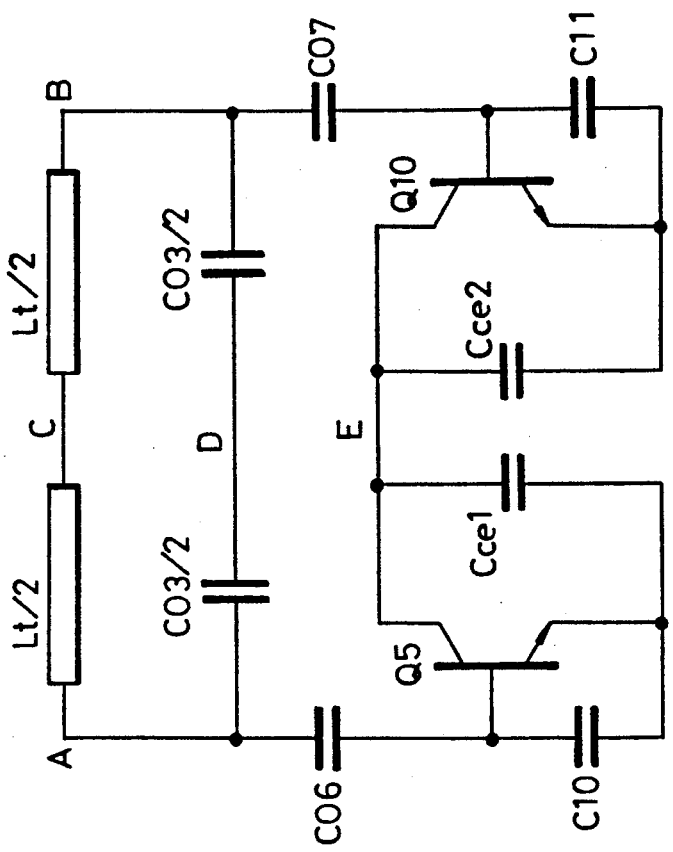
Figure 9:
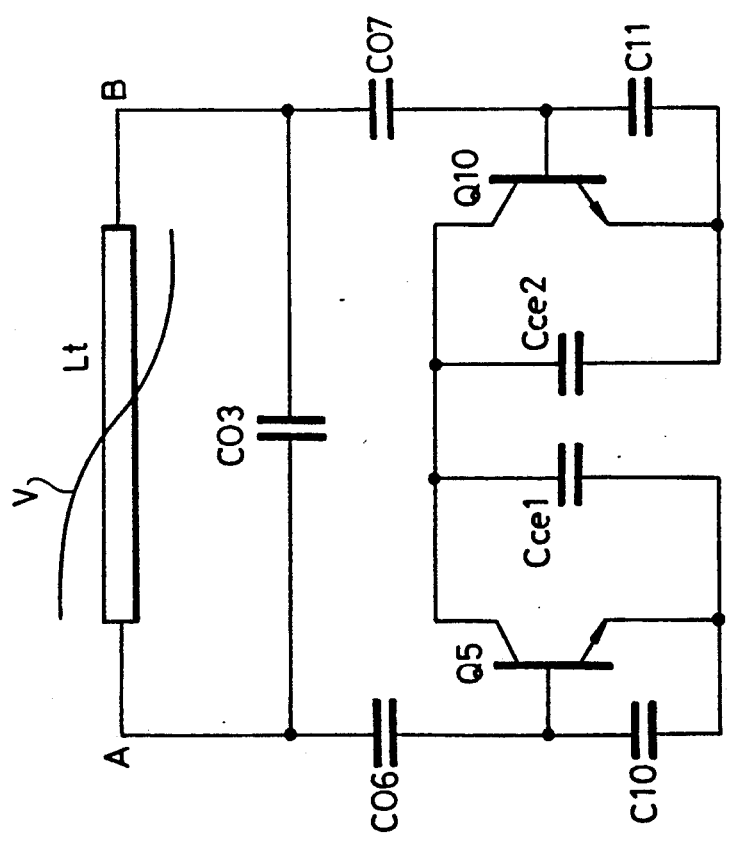
Figure 12:
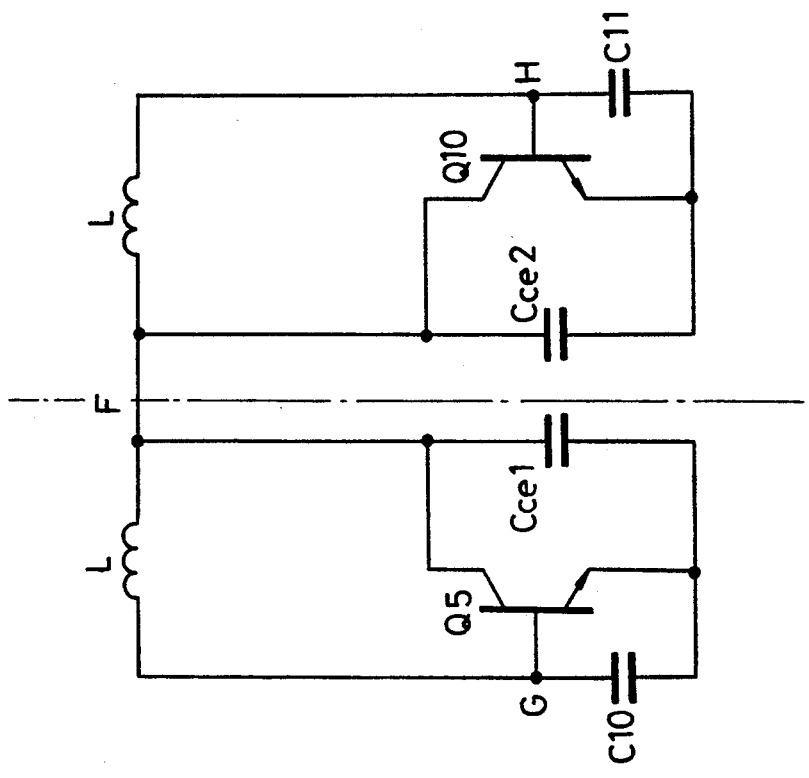
Figure 11:
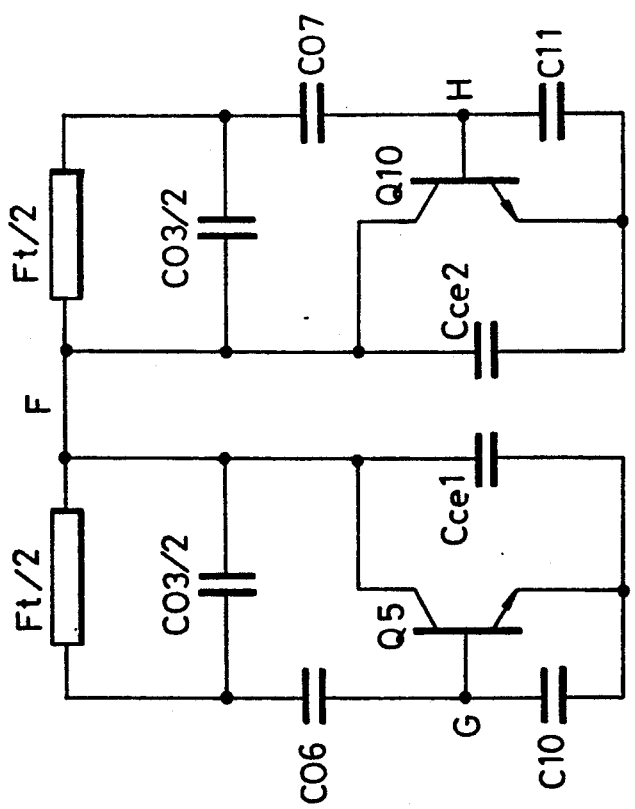

If the distributed parameter line Lt and the capacitor C03 in FIG. 9 are divided in two, the circuit of FIG. 9 can be represented by the circuit of FIG. 10. Since the points C, D, and E in FIG. 10 are considered to be neutral points under application of radio frequency, by converging these points to one point and denoting this point by F, the circuit of FIG. 10 can be represented as the circuit of FIG. 11. Further, since the capacitance values of the capacitors C03, C06, and C07 are selected so that the impedance measured from the point G or point H to the point F in FIG. 11 may become inductive at the oscillation frequency, the circuit of FIG. 11 can be represented by the circuit of FIG. 12. Thus, the radio-frequency equivalent circuit of the UHF local oscillation circuit 34 in FIG. 8 becomes as shown in FIG. 12. As seen from the diagram, the circuits on the left-hand side and the right-hand side of FIG. 12, with the point F in the center, respectively constitute Colpitts oscillation circuits, and as apparent from the standing-wave voltage distribution shown in FIG. 9, the phases of the point A and the point B are opposite and, hence, the transistors Q5 and Q10 constitute a balanced oscillation circuit operating 180° out of phase.

[4] UHF local oscillation amplifier 35

Figure 13:
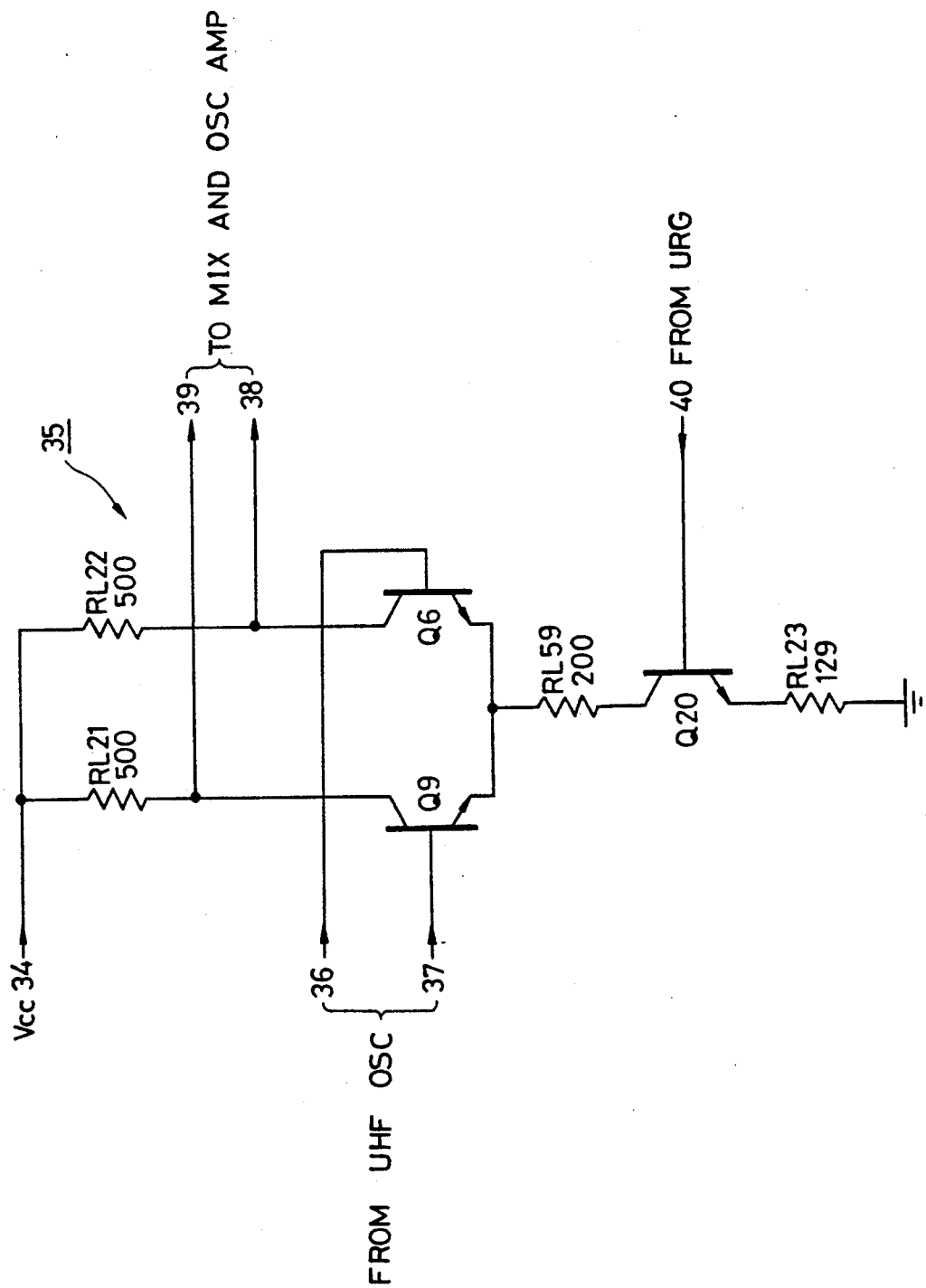

FIG. 13 shows a structure of the UHF local oscillation amplifier 35. This circuit is similar to the VHF local oscillation amplifier 31 (FIG. 7) with the input level adjusting resistor RL3 removed therefrom and a resistor RL59 added to its constant-current circuit.

[5] Pre-IF amplifier 47

Figure 14:
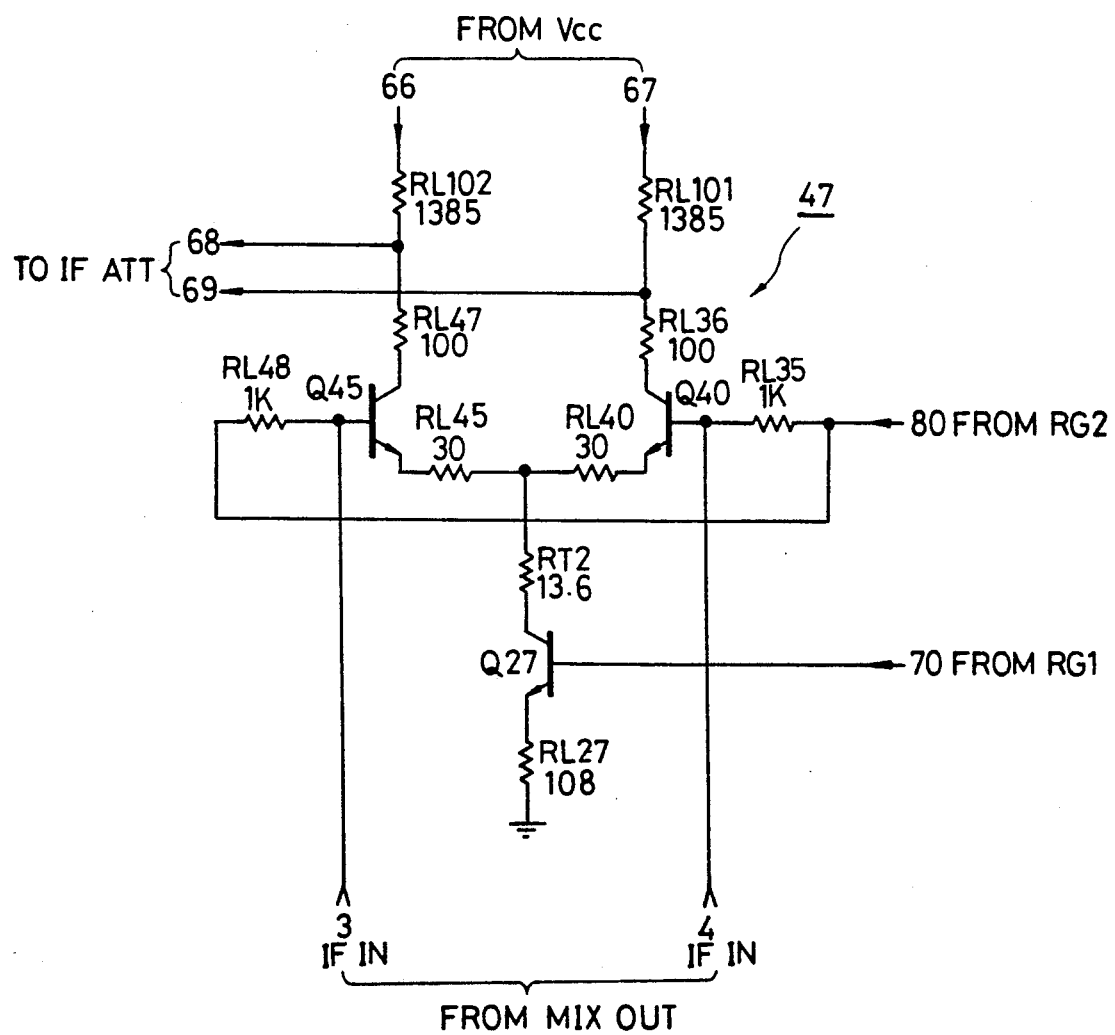

FIG. 14 shows a structure of the pre-IF amplifier 47. In this circuit, Q40 and Q45 denote transistors constituting a differential amplifier and Q27 denotes a transistor constituting a constant-current circuit. The terminal 70 is supplied with a constant-current regulating voltage from the power regulating circuit RG1 (FIG. 3). Hence, the transistor Q27 and the resistor RL27 constitute a constant-current circuit tending to flow a constant current determined by the value of the resistor RL27 and the value of the D.C. voltage from the terminal 70. In addition, a voltage from the constant-voltage generating circuit RG2 is supplied to the terminal 80, wherefrom D.C. bias voltages are supplied to the bases of the transistors Q40 and Q45 through the resistors RL35 and RL48, respectively. The power voltage Vcc is supplied to the collector of the transistor Q40 through the terminal 67 and through the resistors RL101 and RL36. The power voltage Vcc is also supplied to the collector of the transistor Q45 through the terminal 66 and through the resistors RL102 and RL47. In the present circuit, the balanced IF signal input between the terminals 3 and 4 is amplified by the transistors Q40 and Q45 and output to the terminals 68 and 69 through the resistors RL36 and RL47. The resistors RL40 and RL45 function as current feedback resistors for the transistors Q40 and Q45, respectively, and the resistor RT2 is a resistor of a low resistance value a (so-called tunnel resistor) for achieving a two-level crossing, when wirings cross each other in the circuit arrangement on a semiconductor chip, by passing this resistor below the surface of the chip.

Since the resistors RL101 and RL102 are connected between the base and collector of the transistor of the IF amplifier 49 in the succeeding stage, they also serve as the voltage feedback resistors for the IF amplifier 49.

[6] Attenuator 48

Figure 15:
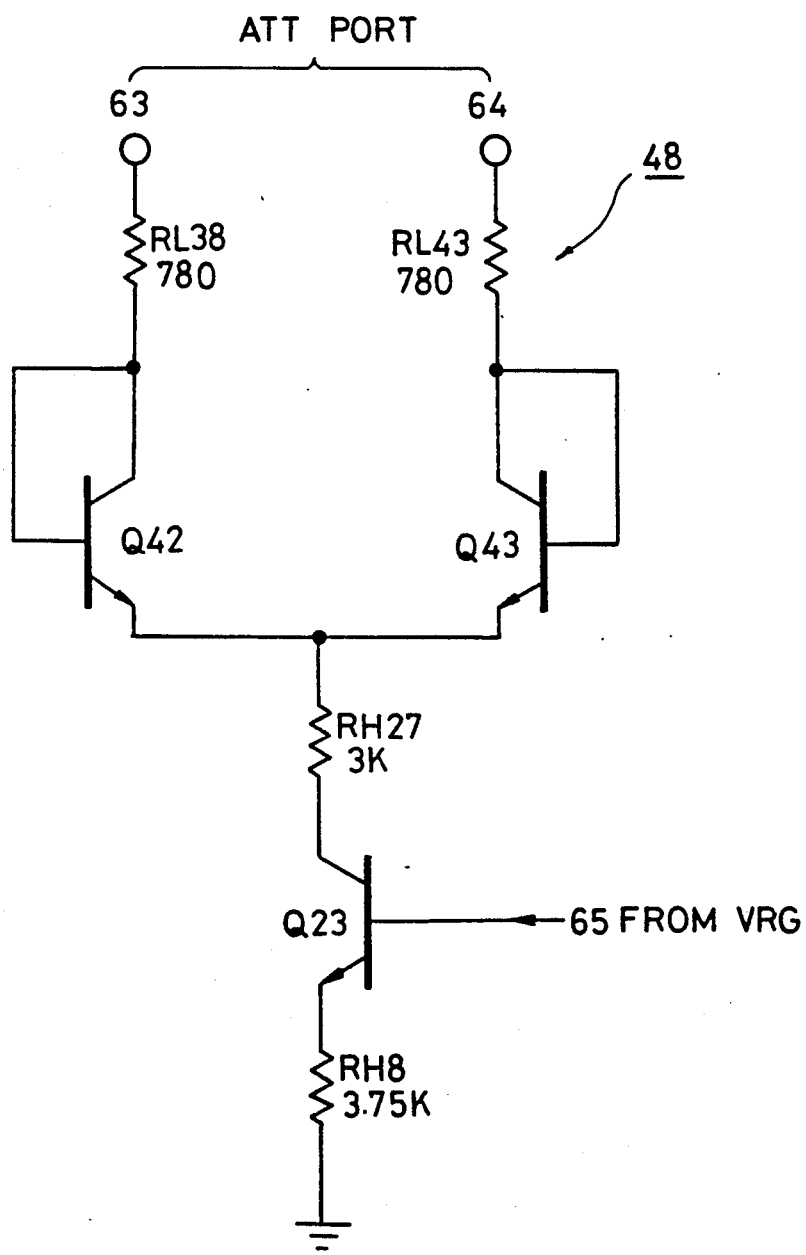

FIG. 15 shows a structure of the attenuator 48. In this circuit, the transistor Q23 and the resistor RH8 constitute a constant-current circuit. The circuit formed of the transistor Q42 and the resistor RL38 and the circuit formed of the transistor Q43 and the resistor RL43 are the attenuator, which is controlled by the above described constant-current circuit. When a constant-current regulating voltage from the VHF power regulating circuit VRG is supplied to the terminal 65, the collector current of the transistor Q23 tends to flow. In this case, the transistors Q42 and Q43 have their respective collector and base shorted, i.e., they are each strapped as a diode, and the terminal 63 is applied with a D.C. voltage through the resistor RL102 (FIG. 14) of the pre-IF amplifier 47. Hence, a D.C. current flows into the constant-current circuit through the terminal 63 and through the resistor RL38 and the transistor Q42. Similarly, a D.C. current flows into the constant-current circuit through the terminal 64 and through the resistor RL43 and the transistor Q43. Therefore, between the terminals 63 and 64, there are provided impedances connected in series comprised of the resistors RL38 and RL43 and the transistors Q42 and Q43 each strapped as a diode.

Since there are currents flowing through the transistors Q42 and Q43, each strapped as a diode, their impedances are low. In addition the impedance between the emitters of the transistors Q42 and Q43 connected in common and the grounded point is very high because of the characteristic of the constant-current circuit. Thus, the impedance value between the terminals 63 and 64 is virtually equal to the series resistance value of the resistors RL38 and RL43.

If a voltage sufficiently lower than the voltage Vbe (base-emitter voltage) of the transistor Q23 is supplied from the VHF power regulator VRG to the terminal 65, no current is allowed to flow through the transistor Q23. Consequently, no current is allowed to flow through the transistors Q42 and Q43 and, hence, the collector-emitter impedance of each becomes very high, and thus, the impedance between the terminals 63 and 64 becomes very high.

Since the terminals 63 and 64 are connected in parallel with the balanced output lines of the pre-IF amplifier 47, the degree of attenuation of the IF signal can be switched by the control signal from the VHF power regulating circuit VRG.

As a means to attenuate a signal on balanced signal lines, there is known a method to connect an impedance element such as a resistor between the balanced signal lines. In order to turn on/off the attenuating effect, a semiconductor switch to be turned on/off may be connected in series with the impedance element. However, there is generally no D.C. potential difference between the balanced signal lines and, hence, the semiconductor switching circuit cannot be effectively used there. Therefore, it becomes necessary to insert impedance elements having a switching function between each of the balanced signal lines and ground. If the values of the impedance elements are different even slightly, the balance between the balanced signal becomes deteriorated.

In the present circuit, when a predetermined D.C. voltage is applied to the terminal 65, the transistor Q23 is turned on. At this time, the transistors Q42 and Q43, each strapped as a diode, are also turned on. Hence, both the lines become connected through the low impedance resistors RL38 and RL43 (one set of the transistor and the resistor may function as well). The impedance measured from the emitters of the transistors Q42 and Q43 to the grounded point is very high because the transitor Q23 is operating to provide a constant current, and hence the impedance between the terminal 63 or 64 and ground is very high. Since the terminals 63 and 64 are connected to the balanced signal lines, both the signal lines are connected in effect through the sum total of the resistance values of the RL38 and RL43. Consequently, an attenuation effect can be achieved without worsening the balance between the balanced signal.

On the other hand, when the D.C. voltage applied to the terminal 65 is lower than the base-emitter voltage of the transistor Q23, or when it is opened, the transistor Q23 is turned off. At this time, no current flows through either of the transistors Q42 and Q43 and both thereof are turned off.

Also in this case, the impedance measured from the emitters of the transistors Q42 and Q43 to the grounded point becomes very high. Thus, the impedance between the terminals 63 and 64 becomes very high not only between the balanced signal lines but also through each of the balanced signal lines and the grounded point. Hence the balanced signal is not attenuated and the balance is not worsened. The attenuator 48 is provided between the pre-IF amplifier 47 and the IF amplifier 49 in consideration of the NF and distortion.

[7] Another example of structure of the attenuator 48

Figure 16:
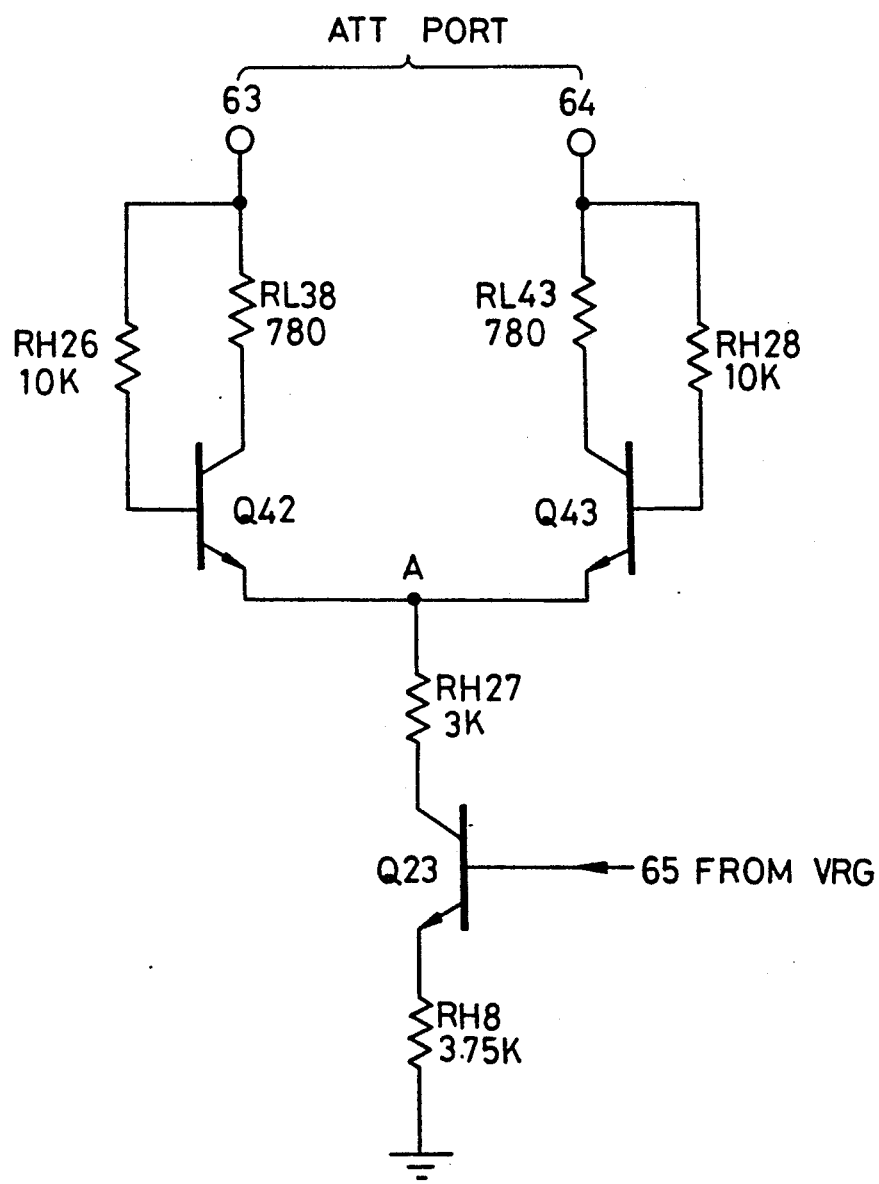

FIG. 16 shows another example of a structure of the attenuator 48. In this circuit, the circuit formed of the transistor Q23 and the resistor RH8 constitutes a constant-current circuit regulated by the constant-current regulating voltage supplied to the terminal 65 from the VHF power regulating circuit VRG. The circuit formed of the transistor Q42 and the resistors RL38 and RH26 and the circuit formed of the transistor Q43 and the resistors RL43 and RH28 constitute an attenuating circuit controlled by the above mentioned constant-current circuit.

If a constant-current regulating voltage is applied to the terminal 65, the transistor Q23 is turned on. The transistor Q42 is thereby turned on and the resistance value between the terminal 63 and the emitter of the transistor Q42 becomes the value of the resistance of the parallel circuit of the resistors RL38 and RH26. Similarly, the transistor Q43 is turned on and the resistance value between the terminal 64 and the emitter of the transistor Q43 becomes the value of the resistance of the parallel circuit of the resistor RL43 and RH28.

When the constant-current regulating voltage is applied to the terminal 65, the impedance between the emitters connected in common of the transistors Q42 and Q43 and the grounded point is sufficiently high because of the characteristic of the constant-current circuit and, hence, the impedance between the terminals 63 and 64 becomes equal to the sum total of the resistance value of the parallel circuit of the resistors RL38 and RH26 and the resistance value of the parallel circuit of the resistors RL43 and RH28.

If a voltage sufficiently smaller than the voltage Vbe (base-emitter voltage) of the transistor Q23 is supplied from the VHF power regulating circuit each of the two sets of the constant-current circuits VRG to the terminal 65, no current flows through the transistor Q23. Hence, no current flows through the transistors Q42 and Q43 making each of the collector-emitter impedance very high. Therefore, the impedances between the terminals 63 and 64 becomes very high. Since the impedance between the point A and the grounded point also becomes high as a matter of course, a very high impedance is produced between the terminals 63 and 64.

[8] IF amplifier 49

Figure 17:
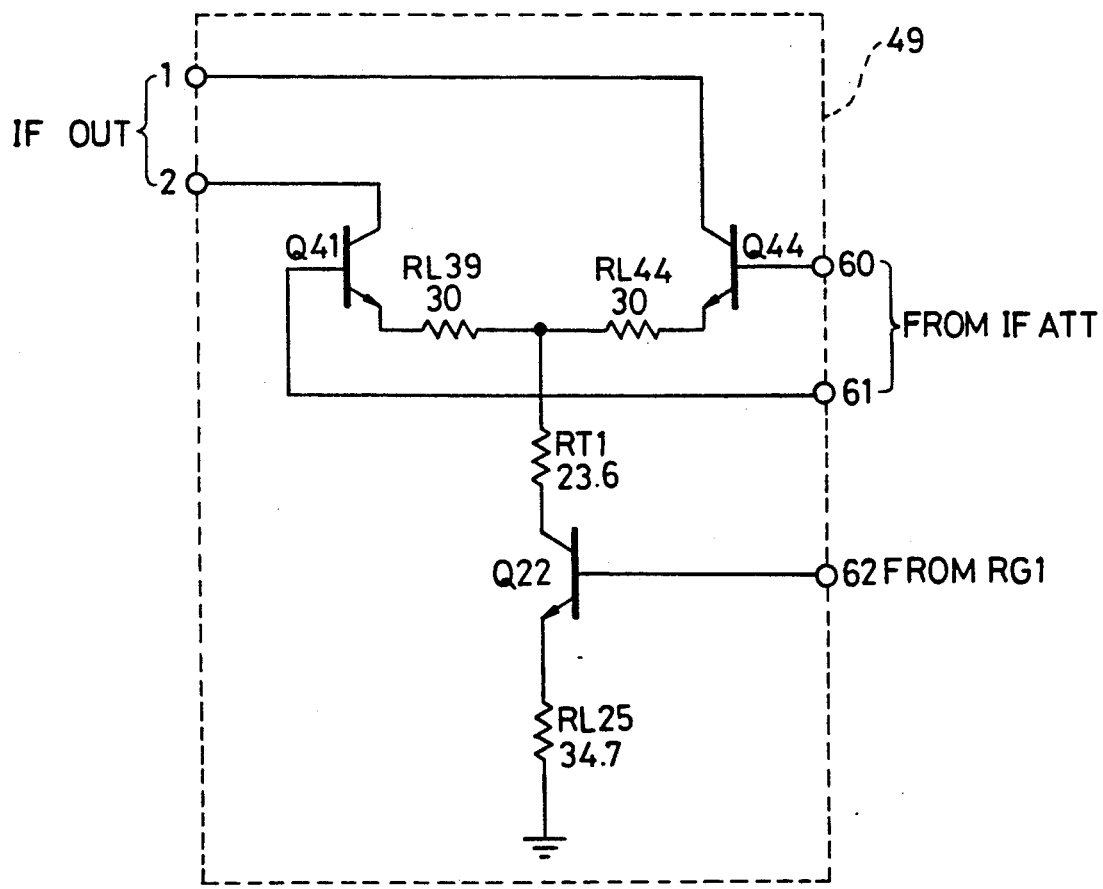

FIG. 17 shows a structure of the IF amplifier 49. In this circuit, Q41 and Q44 denote transistors constituting a differential amplifier and Q22 denotes a transistor constituting a constant-current circuit. The terminal 62 is applied with the constant-current regulating voltage from the power regulating circuit RG1. Hence, a constant current dependent on the value of the resistor RL25 and the value of the constant-current regulating voltage is passed through the collector of the transistor Q22. The terminals 60 and 61 are connected with the output terminal of the pre-IF amplifier 47 and the terminals 1 and 2 are connected to the capacitor C12 and the primary winding of the transformer BAL1 shown in FIG. 2. The transformer BAL1 is a balanced-to-unbalaced transformer having selectivity and the signal at one end of its secondary winding is output to the band-pass-filter 9 shown in FIG. 1.

The resistor RT1 in FIG. 17 is a resistor of a low resistance value a (so-called tunnel resistor) for achieving a two-level crossing, when wirings cross each other in the circuit arrangement on a semiconductor chip, by passing this resistor below the surface of the chip.

[9] UHF RF amplifier 44

Figure 18:
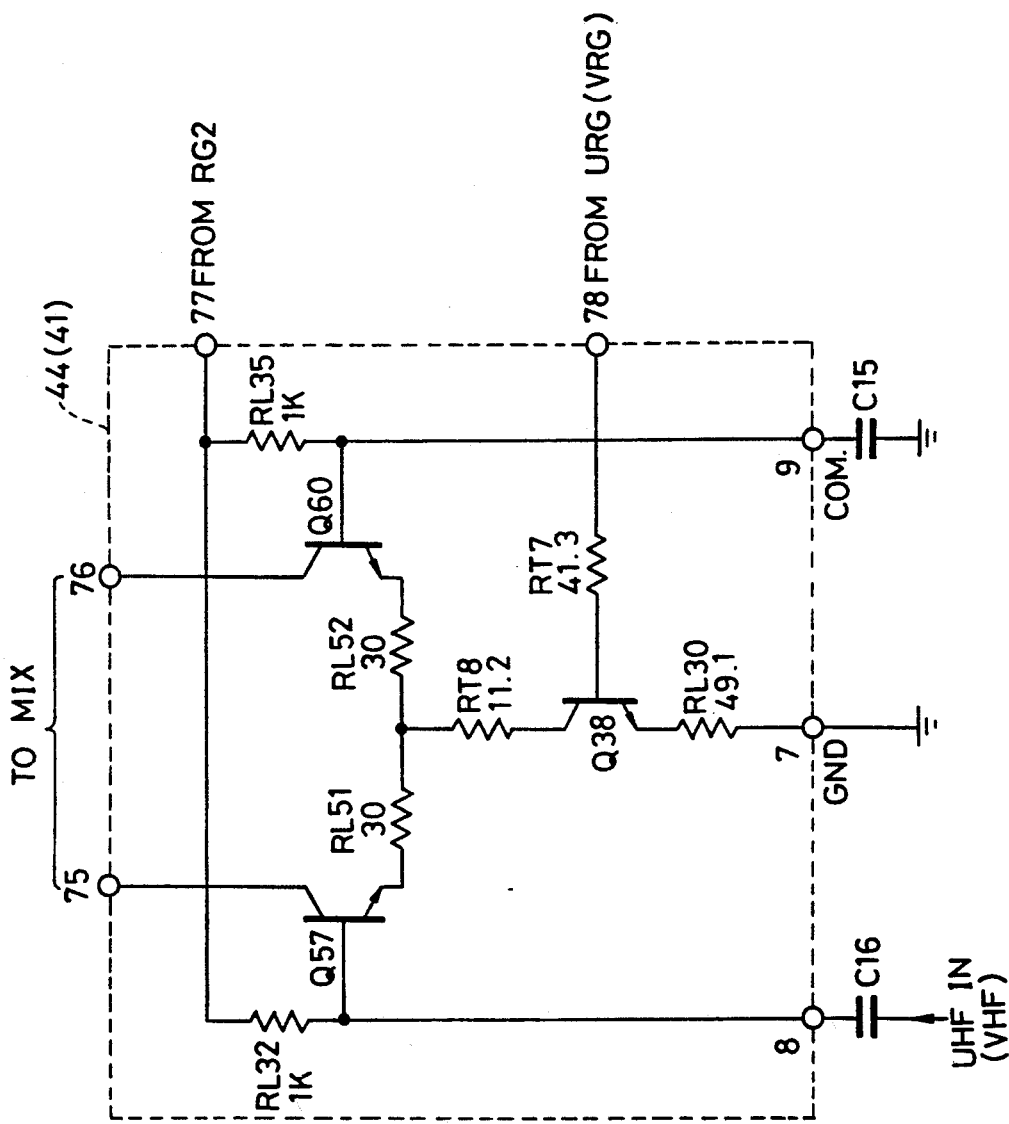

FIG. 18 shows a structure of the UHF RF amplifier 44. In this circuit, Q57 and Q60 denote transistors constituting a differential amplifier and Q38 denotes a transistor constituting a constant-current circuit. The terminal 77 is supplied with the voltage from the constant voltage generating circuit RG2 as the base bias voltage for the transistors Q57 and Q60. The terminals 75 and 76 are connected to the mixer 32 (FIG. 3).

If an unbalanced television signal of the UHF band is input to the UHF input terminal 43 (FIG. 3) while the constant-current circuit is operating (since the capacitors C15 and C16 are capacitors with large capacity for blocking D.C currents, the terminal 9 is grounded for radio frequency and the terminal 8 is connected with the UHF input terminal 43 for radio frequency), the differential amplifier formed of the transistors Q57 and Q60 is activated, whereby an amplified, balanced television signal of the UHF band is output from the collectors of the transistors Q57 and Q60. This television signal is input to the mixer 32 through the terminals 75 and 76.

The resistors RL51 and RL52 function as current feedback resistors for the transistors Q57 and Q60 respectively. The resistors RT7 and RT8 each have a low resistance value (so-called tunnel resistors) for achieving a two-level crossing, when wirings cross each other in the circuit arrangement on a semiconductor chip, by passing each resistor below the surface of the chip.

[10] VHF RF amplifier 41

This circuit is of the same structure as that of the above described UHF RF amplifier 44.

[11] Mixer 32

Figure 19:
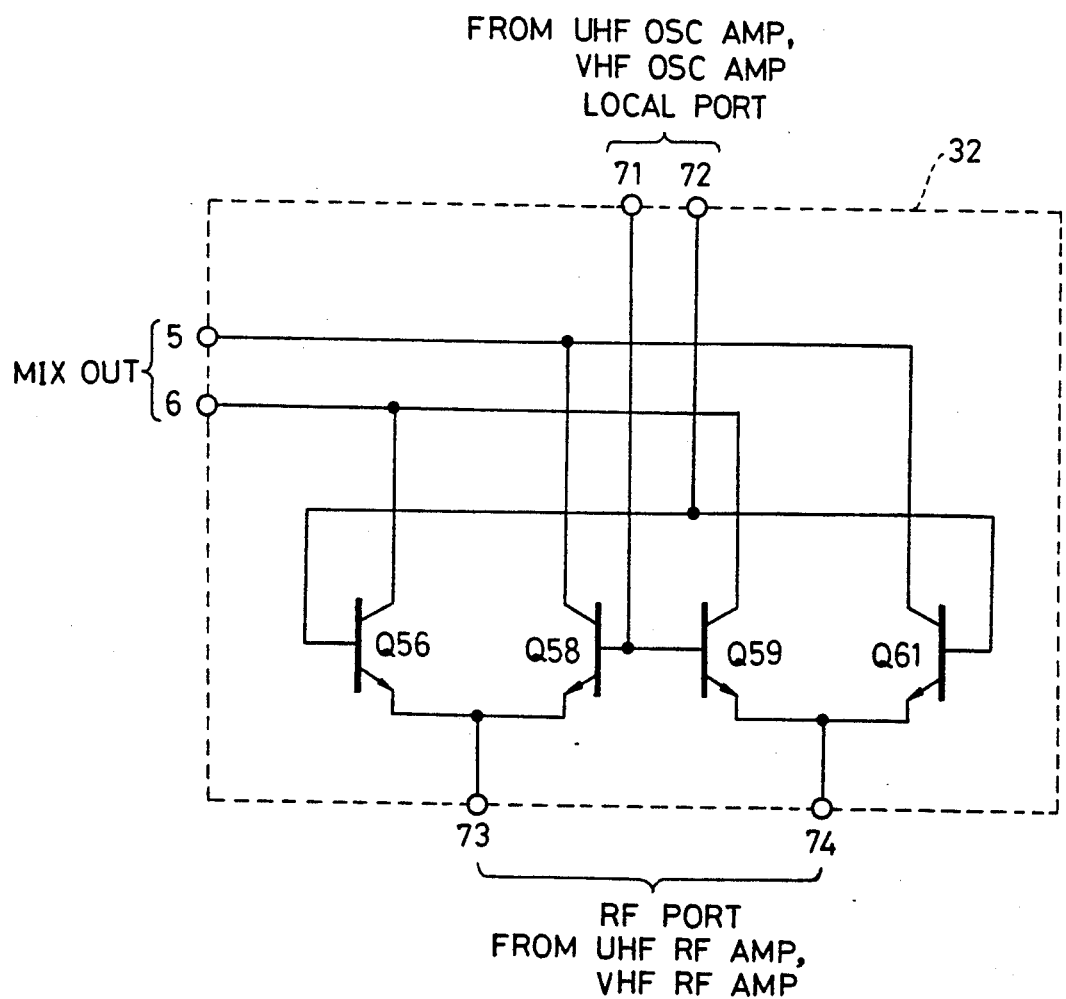

FIG. 19 shows a structure of the mixer 32. The mixer 32 is a two-pair differential mixer circuit constituted of transistors Q56, Q58, Q59, and Q61. In this circuit, the terminals 71 and 72 are supplied with the local oscillation signal from the UHF local oscillation amplifier 35 or the VHF local oscillation amplifier 31. The terminals 73 and 74 are supplied with the output signal from the UHF RF amplifier 44 or the VHF RF amplifier 41. In synchronism with the local oscillation signal from the terminal 71 and 72, the transistors Q58 and Q59, as well as the transistors Q56 and Q61, as a set, cycle on and off continuously. During this process, the television signal input to the terminals 73 and 74 is converted into an IF signal and output from the terminals 5 and 6. The IF signal is input to the balanced impedance converting circuit, having selectivity, formed of the capacitor C13 and the RF transformer BAL2 as shown in FIG. 2. Since this circuit is tuned with the IF, the IF signal is provided with selectivity and it is matched with the input impedance of the pre-IF amplifier 47 by the RF transformer BAL2.

[12] UHF power regulating circuit URG

Figure 20:
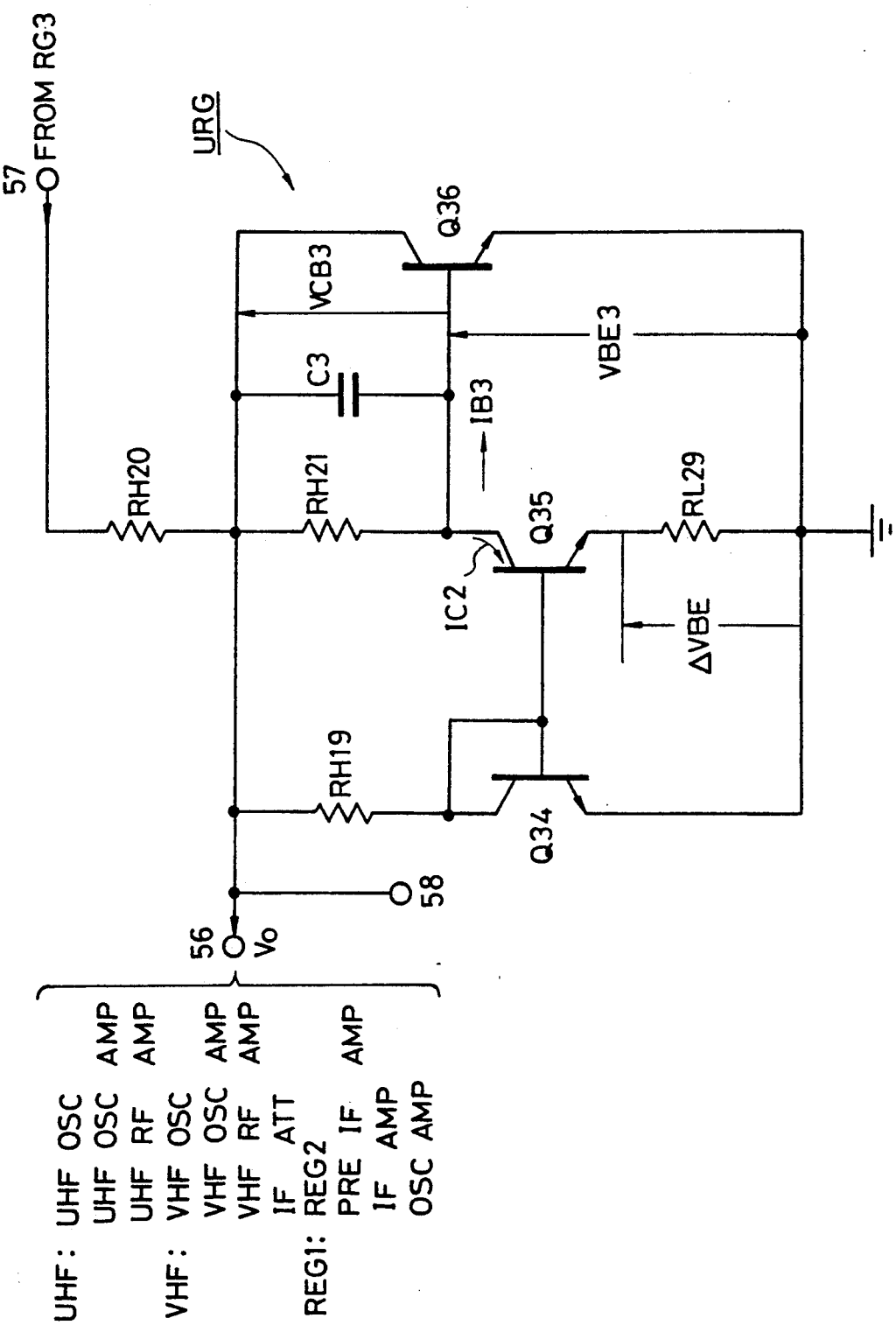

FIG. 20 shows a structure of the UHF power regulating circuit URG. This circuit is generally called a circuit of a band gap reference system. If a constant voltage from the voltage output circuit RG3 is applied to the terminal 57, the following voltage Vo is output from the terminal 56.

$$Vo = VBE3 + VCB3 \quad (1)$$
$$= VBE3 + IC2 \cdot RH21 + IB3 \cdot RH21$$
$$= VBE3 + (\Delta VBE/RL29) \cdot RH21 + IB3 \cdot RH21$$
$$= VBE3 + (RH21/RL29) \times (kT/q)\ln(RH21/RH19),$$

where k represents Boltzmann's constant, q represents quantum of electricity, and T represents absolute temperature.

The differential coefficient with respect to temperature is obtained by differentiating equation (1) with respect to T as $$dVo/dT = (d\text{-}VBE3/dT) + (K/q) \times (RH21/RL29) \times \ln(RH21/R\text{-}H19). \quad (2)$$

Therefore, by suitably selecting the ratios RH21/RL29 and RH21/RH19, an output voltage Vo compensated for temperature can be obtained. This output voltage Vo is applied as the constant-current regulating voltage to the constant-current circuit for each of the UHF local oscillation circuit 34, the UHF local oscillation amplifier 35, and the UHF RF amplifier 44. The terminal 58 is connected to the output terminal of the U/V switching circuit 53, and the output terminal 56 and ground is shorted or opened depending on the output of the U/V switching circuit 53.

[13] VHF power regulating circuit VRG

The structure of the VHF power regulating circuit VRG is the same as that of the above described UHF power regulating circuit URG. The output voltage of this circuit is supplied as the constant-current regulating voltage to the constant-current circuit for each of the VHF local oscillation circuit 30, the VHF local oscillation amplifier 31, the VHF RF amplifier 41, and the attenuator 48.

[14] Power regulating circuit RG1

The power regulating circuit RG1 is of the same structure as that of the above described UHF power regulating circuit URG but is not provided with the terminal 58. The output voltage of this circuit is supplied at all times as the constant-current regulating voltage to the constant-current circuit for each of the pre-IF amplifier 47, the IF amplifier 49, and the amplifier 33 and, in addition, is supplied as the power voltage to the constant voltage generating circuit RG2 described below.

[15] Constant voltage generating circuit RG2

Figure 21:
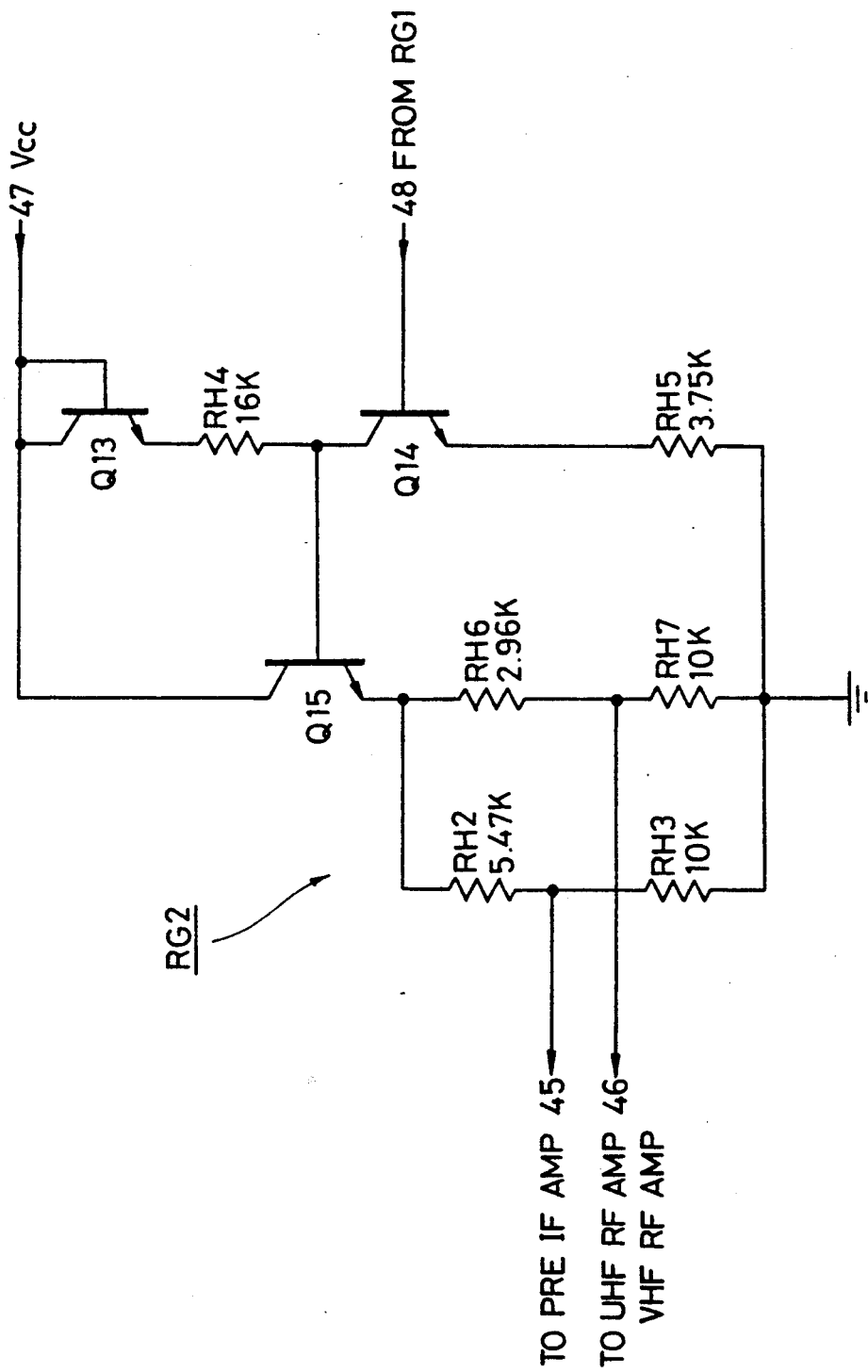

FIG. 21 shows a structure of the constant voltage generating circuit RG2. If the power voltage Vcc is applied to the terminal 47 and the constant voltage compensated for temperature from the power regulating circuit RG1 is supplied to the terminal 48, a collector current whose value is determined by the value of the constant voltage and the value of the resistor RH5 is allowed to flow through the transistor Q14. Thereby, at the collector of the transistor Q14, there is produced a collector voltage corresponding to the voltage Vcc less the sum total of the voltage drop across the transistor Q13 strapped as a diode and the voltage drop across the resistor RH4. Since this collector voltage is applied to the base of the transistor Q15, there appears at the emitter of the transistor Q15 a voltage which is still lower than the applied voltage by the base-emitter voltage of the transistor Q15 (VBE: approximately 0.7V). Thus, at the output terminal 45, there appears a voltage corresponding to the emitter voltage of the transistor Q15 divided by the resistors RH2 and RH3, and at the output terminal 46, there appears a voltage corresponding to the emitter voltage of the transistor Q15 divided by the resistors RH6 and RH7. The voltage from the output terminal 45 is supplied as the bias voltage to the pre-IF amplifier 47 and the voltage from the output terminal 46 is supplied as the bias voltages to the UHF RF amplifier 44 and the VHF RF amplifier 41.

[16] Voltage output circuit RG3

Figure 22:
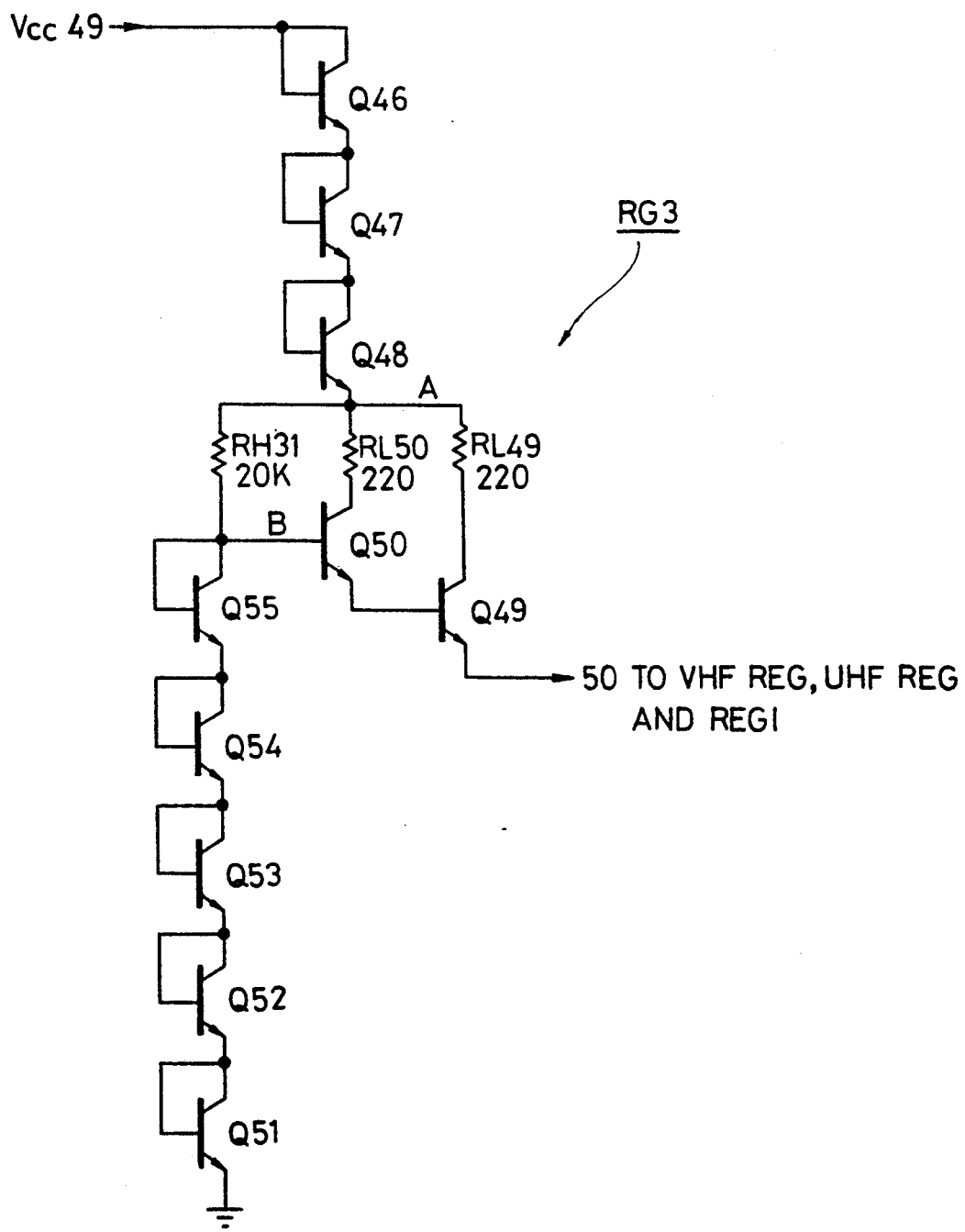

FIG. 22 shows a structure of the voltage output circuit RG3. In this diagram, the transistors Q46, Q47, and Q48, each strapped as a diode, are for providing a voltage drop, whereby the voltage at the point A is lowered by 2 to 3 V from the power voltage Vcc. The transistors Q51 to Q55, each strapped as a diode, are for determining the voltage at the point B.

In this circuit, if a load circuit passing a D.C. current therethrough is connected to the output terminal 50, the transistors Q50 and Q49 are activated and, thereby, at the emitter of the transistor Q50, there appears an emitter voltage lower than the voltage at the point B by an amount Vbe of the transistor Q50. At the emitter of the transistor Q49, there appears an emitter voltage still lower than the emitter voltage of the transistor Q50 by an amount Vbe of the transistor Q49. This voltage is output from the output terminal 50 and is supplied to the UHF power regulating circuit URG, the VHF power regulating circuit VRG, and the constant voltage generating circuit RG1.

The emitter of the transistor Q50 passes therethrough a current obtained by multiplying the base current by HFE (the current amplification factor of Q50) and the emitter of the transistor Q49 passes therethrough a current obtained by multiplying the emitter current of the transistor Q50 by HFE (the current amplification factor of Q49). That is, the base current of the transistor Q50 can be very small and, hence, the current variation at the point B becomes small and the voltage regulation at the point B also becomes small. Thus, it becomes possible to have a stable D.C. voltage output regardless of the changes in the load impedance.

[17] U/V switching circuit 53

Figure 23:
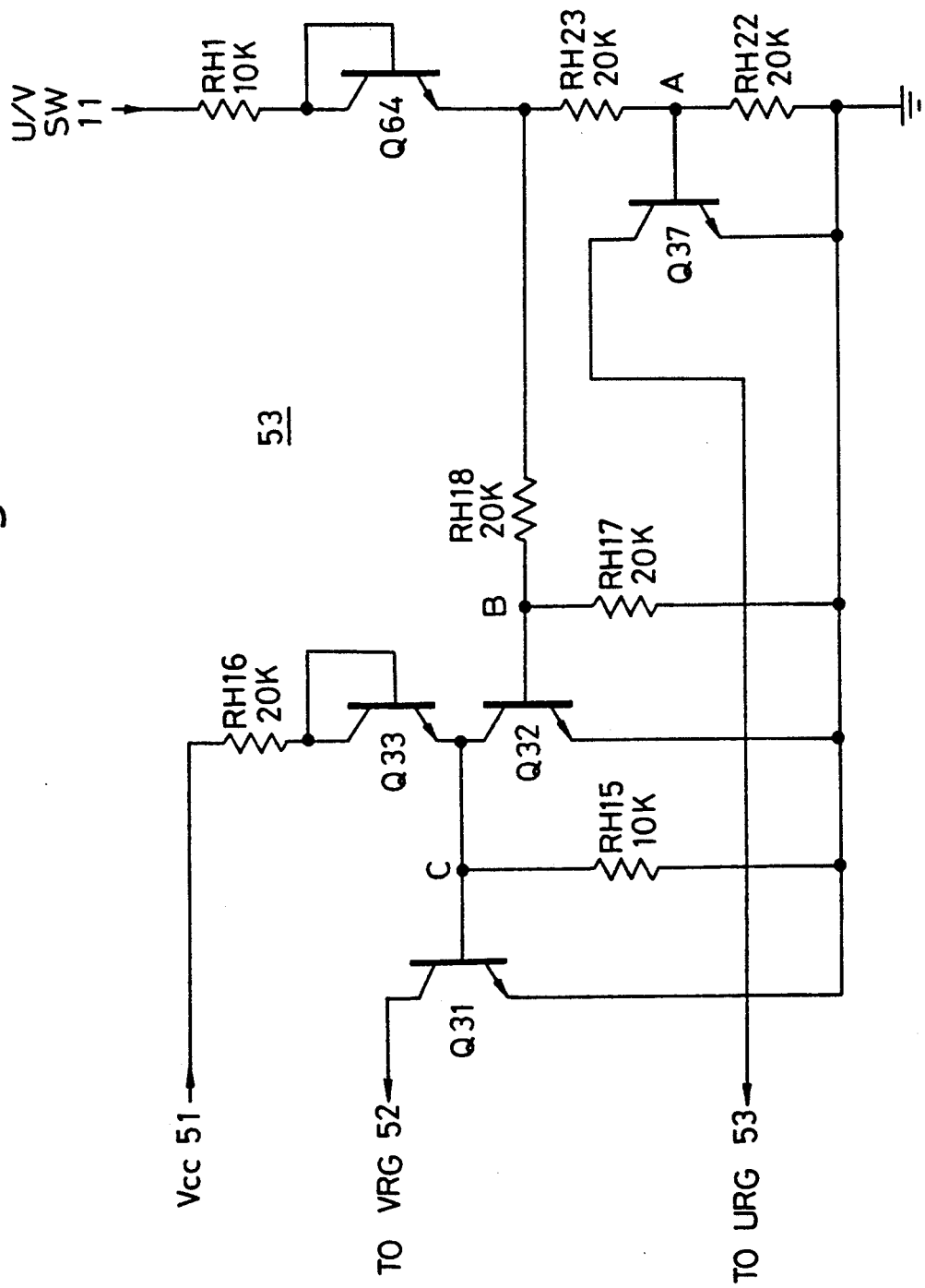

FIG. 23 shows a structure of the U/V switching circuit 53. In this circuit, the terminal 51 is supplied with the power voltage Vcc. The terminal 52 is connected to the terminal 58 of the VHF power regulating circuit VRG (refer to FIG. 20), and the terminal 53 is connected to the terminal 58 of the UHF power regulating circuit URG.

If a D.C. voltage is applied to the terminal 11, a current is allowed to flow from the terminal 11 to the grounded point through the resistor RH1, transistor Q64 strapped as a diode, and the resistors RH23, RH22, RH18, and RH17. As a result, predetermined voltages appear at the point A and point B, whereby the transistor Q37 is turned on and the potential at the terminal 53 is brought virtually to the grounded potential (approximately, 0 V). Also, the transistor Q32 is turned on and the potential at the point C is brought virtually to the grounded potential (approximately, 0 V), whereby the transistor Q31 is turned off and the terminal 52 is opened.

On the other hand, if the terminal 11 is opened, the potential at the point A and point B is brought to the grounded potential (0 V) and, hence, the transistors Q32 and Q37 are turned off. As a result, the terminal 53 is opened and the voltage Vcc from the terminal 51 is transferred to the point C through the resistor RH16 and the transistor Q33 strapped as a diode, whereby the transistor Q31 is turned on. Upon turning on of the transistor Q31, the potential at the terminal 52 is brought virtually to the grounded potential (approximately, 0 V).

Therefore, at the time when the television signal of the VHF band is received, the terminal 52 is opened with a predetermined D.C. voltage applied to the terminal 11, whereby the output of the VHF power regulating circuit VRG is turned on (enabled). In addition, the potential at the terminal 53 is brought virtually to the grounded potential (approximately, 0 V) and, hence, the output of the UHF power regulating circuit URG is turned off (disabled). On the other hand, when the television signal of the UHF band is received, the terminal 11 is opened. Thereby, the output of the VHF power regulating circuit VRG is turned off and the output of the UHF power regulating circuit URG is turned on.

[18] Amplifier 33

Figure 24:
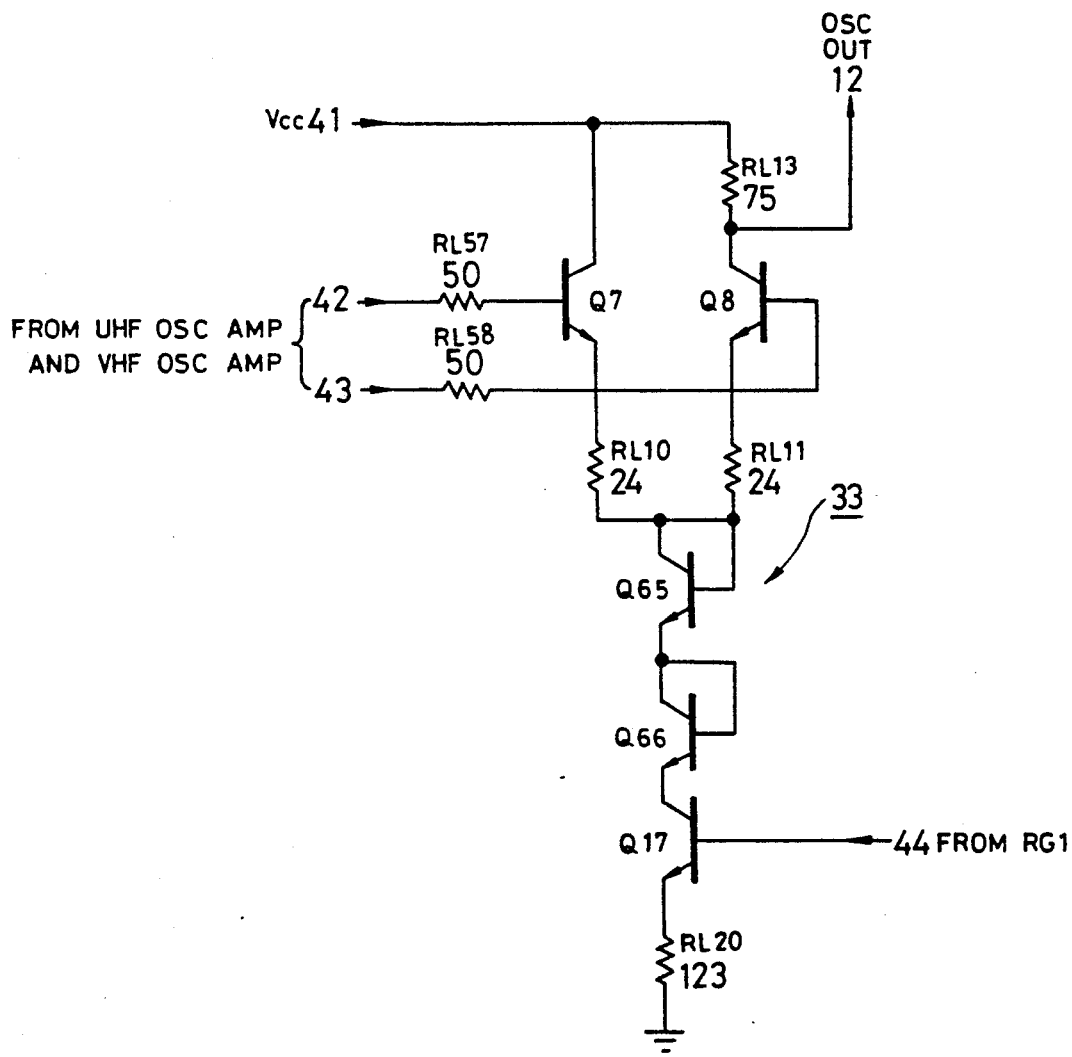

FIG. 24 shows a structure of the amplifier 33. In this circuit, Q7 and Q8 denote transistors constituting a differential amplifier and Q17 denotes a transistor constituting a constant-current circuit. The transistors Q65 and Q66 are voltage shifting transistors, each strapped as a diode, for adjusting the voltage Vce of the transistor Q7 and transistor Q8.

To the input terminals 42 and 43 of the circuit, either the output signal of the UHF local oscillation amplifier 35 or the output signal of the VHF local oscillation amplifier 31 is input, and this signal is amplified by the transistors Q7 and Q8, whereby an unbalanced local oscillation signal is output from the output terminal 12. This output signal is used as the sampling frequency in the PLL circuit P1 shown in FIG. 1.

According to the present invention, as described so far, since the received signals of the UHF band and VHF band are converted into an IF signal for the television receiver by the mixer for common use, it has advantages over the prior art apparatus in that it requires only a single mixer, thus making the structure simpler. Since the number of line crossings when the circuits are arranged in an IC array can be reduced, stray capacitance can be reduced and it becomes easier to obtain high performance of the apparatus.

Since, according to the present invention, an attenuator is provided for the output of the mixer, it becomes possible, when a signal of the VHF band is received, to attenuate the received signal so that the difference between the gains of signals of the VHF band and the UHF band may be eliminated without worsening the NF.

Further, according to the present invention, higher harmonics from the prescaler are prevented from penetrating into the mixer and the local oscillation circuit and, hence, the operation of the apparatus can be stabilized and kept free from beat disturbance.

In addition, according to the present invention, the RF amplifiers and oscillators for the UHF/VHF bands are provided with respective constant-current transistor circuits. The transistors of the constant-current circuits are associated with respective control circuits for supplying constant voltages to the control terminals for turning off the transistors according to the selection of the UHF/VHF band. Therefore, each receiving circuit is kept free from the adversary effects caused by changes in the load impedances of the amplifying elements. In addition, the separation between the VHF and UHF bands is not worsened.

What is claimed is:

1. A tuning apparatus for a television receiver comprising:
   a first amplifier and a second amplifier for amplifying signals of a first band and a second band, respectively;
   a mixer for common use for converting an output signal from either of said first and second amplifiers to an intermediate frequency for a television receiver;
   a first local oscillator for supplying said mixer with a local oscillation signal corresponding to said first band and a second local oscillator for supplying said mixer with a local oscillation signal corresponding to said second band;
   a first control circuit for controlling the activated state of said first amplifier and said first local oscillator;
   a second control circuit for controlling the activated state of said second amplifier and said second local oscillator; and
   a switching circuit for supplying said first or said second control circuit with a signal for activating either said first amplifier and said first local oscillator or said second amplifier and said second local oscillator;
   wherein said first and second amplifiers each have an amplifying transistor circuit and said first and second local oscillators each have an oscillating transistor circuit, and wherein each of said first and second amplifiers has a constant current circuit between said amplifying transistor circuit and ground and wherein each of said first and second local oscillators has a constant current circuit between said oscillating transistor circuit and ground, and wherein said constant current circuit of said first amplifier and said constant current circuit of said first local oscillator or said constant current circuit of said second amplifier and said constant current circuit of said second local oscillator are selectively activated by said first or said second control circuit.

2. A tuning apparatus for a television receiver according to claim 1, wherein the local oscillation signal from said first local oscillator and the local oscillation signal from said second local oscillator are supplied to said mixer through a third amplifier and a fourth amplifier, respectively, and the output signal from said third amplifier and said fourth amplifier is supplied through a fifth amplifier for common use to a PLL circuit for controlling the oscillation frequency of said first local oscillator and said second local oscillator.

3. A tuning apparatus for a television receiver according to claim 1, wherein an output line of said mixer is connected to an attenuator whose degree of attenuation when a signal of the first band is received and that when a signal of the second band is received are different.

4. A tuning apparatus for a television receiver according to claim 3, wherein a sixth amplifier and a seventh amplifier are connected in series with the output of said mixer and said attenuator is provided between said sixth amplifier and seventh amplifier.

5. A tuning apparatus for a television receiver according to claim 3, wherein said output line of said mixer is arranged in a balanced type configuration and said attenuator is inserted between a pair of output terminals of said mixer.

6. A tuning apparatus for a television receiver according to claim 5, wherein said attenuator is formed of a resistor and a first semiconductor switching element, and wherein a second semiconductor switching element for turning on/off said first semiconductor switching element is provided between said first semiconductor switching element and ground.

7. A tuning apparatus for a television receiver according to claim 2, wherein an output line of said mixer is connected to an attenuator whose degree of attenuation when a signal of the first band is received and that when a signal of the second band is received are different.

8. A tuning apparatus for a television receiver according to claim 4, wherein said output line of said mixer is arranged in a balanced type configuration and said attenuator is inserted between a pair of output terminals of said mixer.

* * * * *